(12) United States Patent
Watanabe et al.

(10) Patent No.: US 7,638,772 B2
(45) Date of Patent: Dec. 29, 2009

(54) IMAGING APPARATUS AND RADIATION IMAGING SYSTEM

(75) Inventors: Minoru Watanabe, Honjo (JP); Chiori Mochizuki, Sagamihara (JP); Takamasa Ishii, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 42 days.

(21) Appl. No.: 12/034,969

(22) Filed: Feb. 21, 2008

(65) Prior Publication Data
US 2008/0203311 A1   Aug. 28, 2008

(30) Foreign Application Priority Data
Feb. 28, 2007   (JP)   ............................. 2007-049368
Feb. 7, 2008    (JP)   ............................. 2008-027664

(51) Int. Cl.
*G01T 1/24* (2006.01)
(52) U.S. Cl. ................................. 250/370.08
(58) Field of Classification Search ............. 250/370.08
See application file for complete search history.

(56) References Cited

U.S. PATENT DOCUMENTS

| 6,366,443 | B1 * | 4/2002 | Devoe et al. | 361/313 |
|---|---|---|---|---|
| 6,489,619 | B2 * | 12/2002 | Street | 250/370.09 |
| 7,435,968 | B2 * | 10/2008 | Watanabe et al. | 250/370.14 |
| 2002/0056810 | A1 | 5/2002 | Kobayashi et al. | |
| 2003/0010922 | A1 | 1/2003 | Yoon et al. | |
| 2003/0226974 | A1 * | 12/2003 | Nomura et al. | 250/370.11 |
| 2007/0295966 | A1 | 12/2007 | Watanabe et al. | 257/72 |

FOREIGN PATENT DOCUMENTS

WO   WO 2004073067 A1 *   8/2004
WO   WO 2005050981 A1 *   6/2005

* cited by examiner

*Primary Examiner*—David P Porta
*Assistant Examiner*—Shun Lee
(74) *Attorney, Agent, or Firm*—Fitzpatrick, Cella, Harper & Scinto

(57) ABSTRACT

An imaging apparatus includes a plurality of pixels disposed on an insulation substrate. Each of the pixels includes a plurality of thin-film transistors, a conversion element disposed above the TFTs, and a plurality of insulating layers disposed between the conversion element and the plurality of TFTs. The plurality of TFTs includes a reading TFT having a gate electrode electrically connected to the conversion element and a first selecting TFT electrically connected to a source electrode or a drain electrode of the reading TFT. At least one of a signal wiring, to which a signal corresponding to an electric charge obtained by conversion of incident light or radiation performed by the conversion element is transferred, and a gate wiring that supplies a driving signal to a gate electrode of the first selecting thin-film transistor, is disposed between the plurality of insulating layers.

10 Claims, 22 Drawing Sheets

IMAGING APPARATUS AND RADIATION IMAGING SYSTEM

BACKGROUND OF THE INVENTION

1. Field of the Invention

The present invention relates to an imaging apparatus that includes a thin-film transistor (TFT) and a conversion element, a method for manufacturing the imaging apparatus, and a radiation imaging system.

2. Description of the Related Art

A technique for manufacturing a liquid crystal panel that employs a TFT is utilized in an area sensor that includes a conversion element that converts light (e.g., visible light) or radiation (e.g., an X ray) into an electric signal.

U.S. Patent No. 2003-0010922 describes an apparatus that includes a first protecting insulation layer on a TFT array, storage capacity electrodes connected to a ground wire on the first protecting insulation layer, a second protecting insulation layer that covers the storage capacity electrodes formed on the first protecting insulation layer, and a pixel electrode connected to a drain electrode of the TFT on the second protecting insulation layer, with at least one portion of the storage capacity electrodes shielding the TFT region. U.S. Patent No. 2002-0056810 describes an apparatus that includes a reading field-effect transistor having a gate for receiving a signal charge generated in the photoelectric conversion element and a source and a drain for reading a signal corresponding to the signal charge accumulated in the gate.

However, in known apparatuses, when a plurality of TFTs is arranged, the number of wirings that cross a signal wiring via a gate insulation layer is increased, thus increasing a parasitic capacitance. This reduces a signal-to-noise (S/N) ratio.

SUMMARY OF THE INVENTION

The present invention provides an imaging apparatus that includes pixels each having a conversion element and a plurality of TFTs, has a reduced capacitance between wirings, and achieves a high S/N ratio.

An imaging apparatus according to an aspect of the present invention includes an insulation substrate and a plurality of pixels disposed on the insulation substrate. Each of the plurality of pixels includes a plurality of thin-film transistors, a conversion element disposed above the plurality of thin-film transistors, and a plurality of insulating layers disposed between the conversion element and the plurality of thin-film transistors. The plurality of thin-film transistors includes a reading thin-film transistor having a gate electrode electrically connected to the conversion element and a first selecting thin-film transistor electrically connected to a source electrode or a drain electrode of the reading thin-film transistor. At least one of a signal wiring, to which a signal corresponding to an electric charge obtained by conversion of incident light or radiation performed by the conversion element is transferred, and a gate wiring that supplies a driving signal to a gate electrode of the first selecting thin-film transistor, is disposed between the plurality of insulating layers.

Therefore, the present invention can provide an imaging apparatus that has a reduced capacitance between wirings and achieves a high S/N ratio.

Further features of the present invention will become apparent from the following description of exemplary embodiments with reference to the attached drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

An imaging apparatus according to the embodiments of the present invention can convert light, such as visible light and infrared light, or radiation, such as an X ray, α ray, β ray, and γ ray, into an electric signal.

A conversion element according to the embodiments of the present invention converts light, such as visible light and infrared light, or radiation, such as an X ray, α ray, β ray, and γ ray, into an electric charge. For converting light, such as visible light, into an electric signal, a photoelectric conversion element that uses hydrogenated amorphous silicon can be employed, for example. Examples of the photoelectric conversion element include an MIS conversion element and a PIN conversion element. For converting radiation, such as an X ray, γ ray, and α ray, into an electric signal, a scintillator layer serving as a wavelength converting layer that converts radiation into light capable of being photoelectrically converted (e.g., visible light) is combined into the photoelectric conversion element. A direct conversion element that directly converts radiation (e.g., an X ray) using amorphous selenium, cadmium telluride, or lead iodide can be employed.

A best mode for carrying out the present invention will be described below with reference to the accompanying drawings.

First Embodiment

Figure 1:
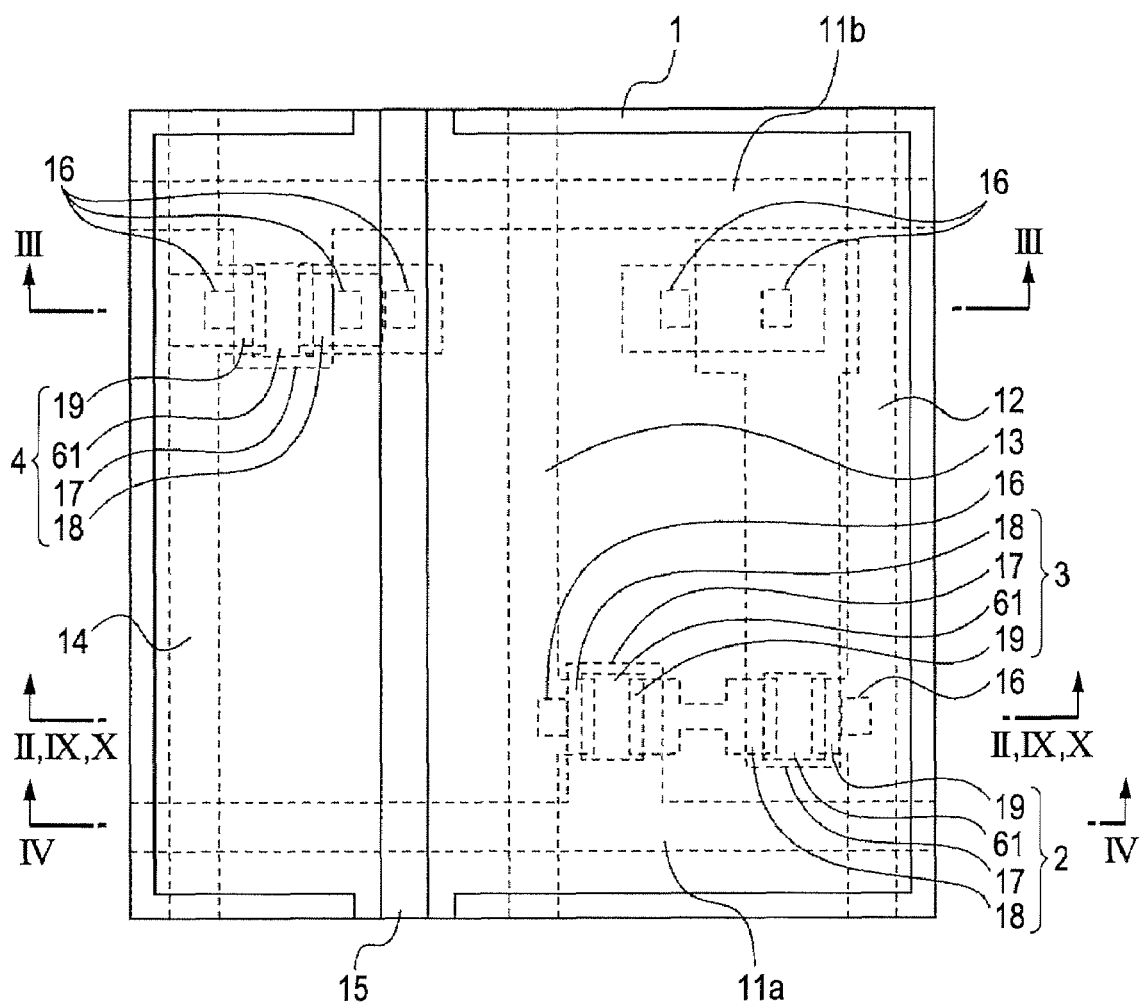
FIG. 1 is a plan view of a pixel according to a first embodiment of the present invention.
Figure 5:
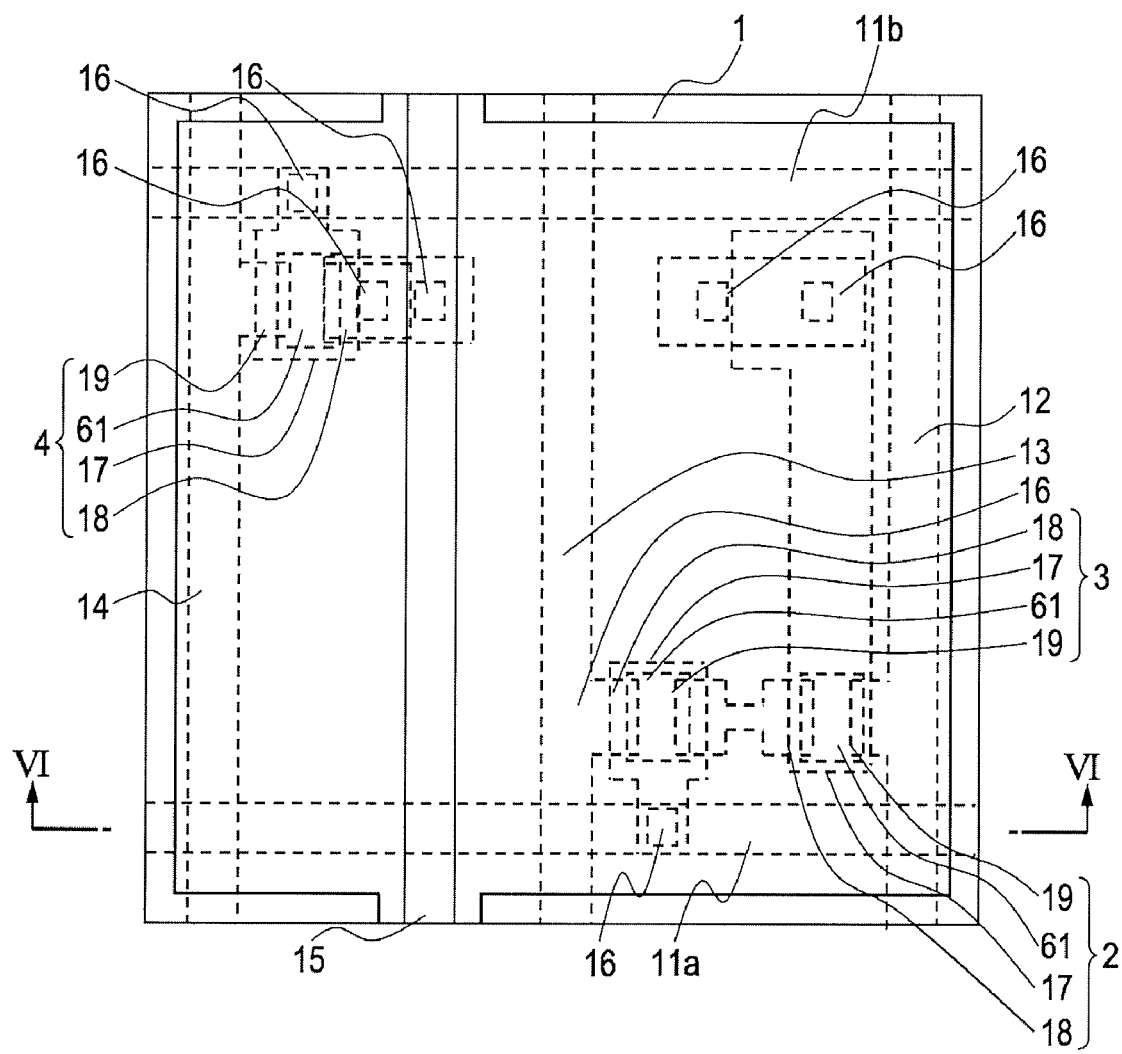
FIG. 5 is a plan view of a pixel having a different configuration from that in FIG. 1 according to the first embodiment.
Figure 6:
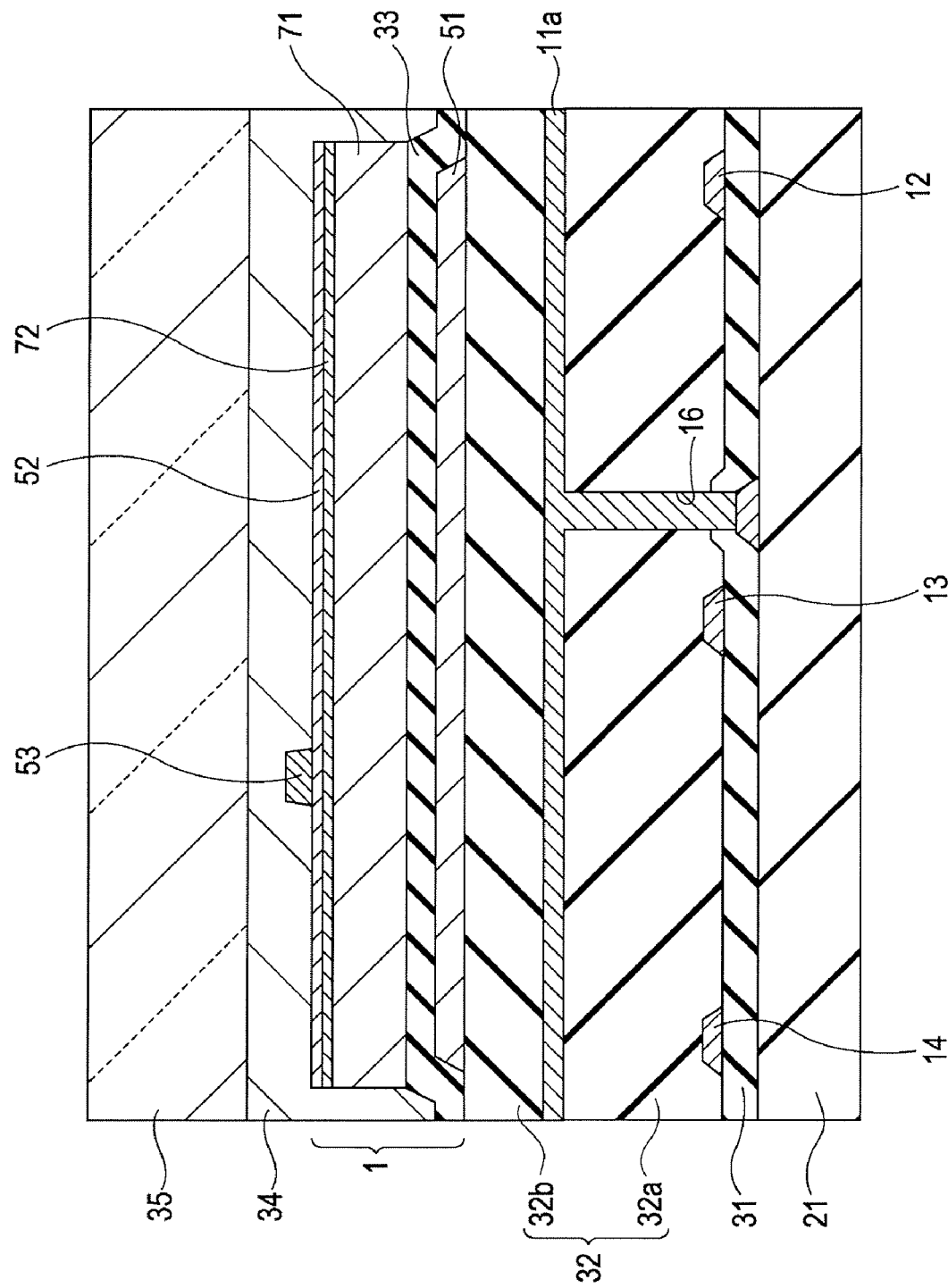
FIG. 6 is a cross-sectional view taken along the line VI-VI of FIG. 5.
Figure 7:
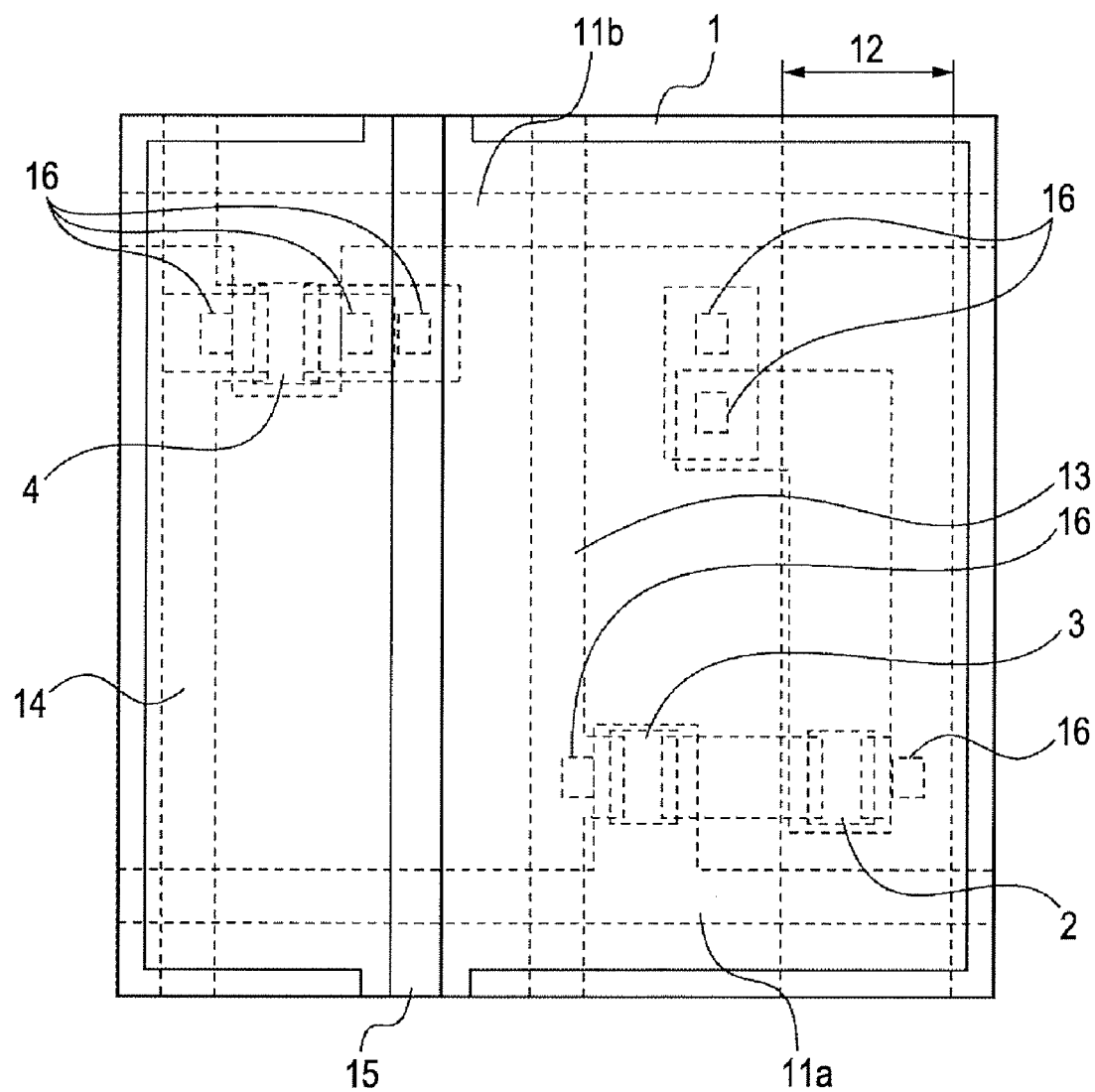
FIG. 7 is a plan view of a pixel having a different configuration from that in FIG. 1 according to the first embodiment.
Figure 8:
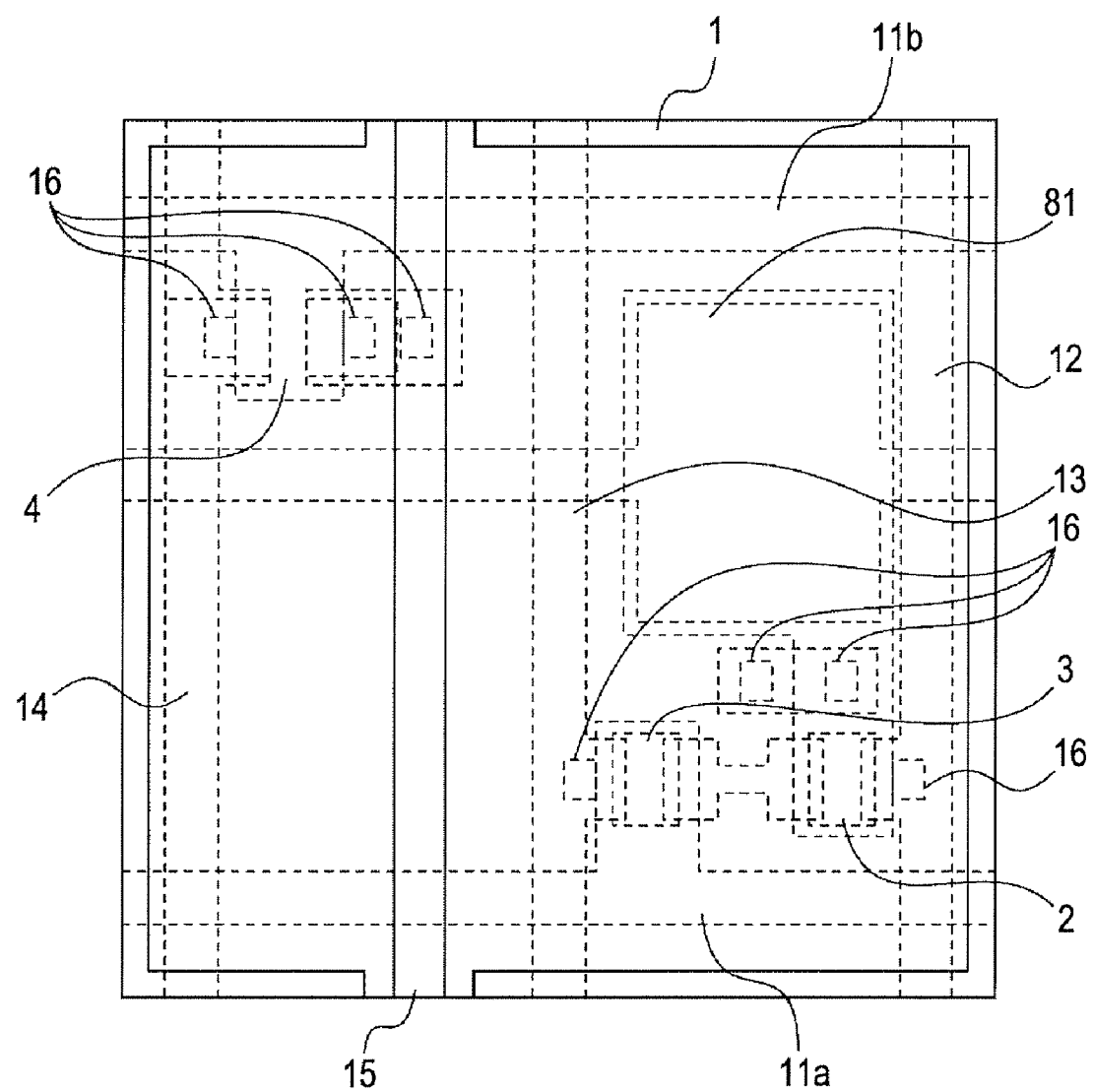
FIG. 8 is a plan view of a pixel having a different configuration from that in FIG. 1 according to the first embodiment.
Figure 9:
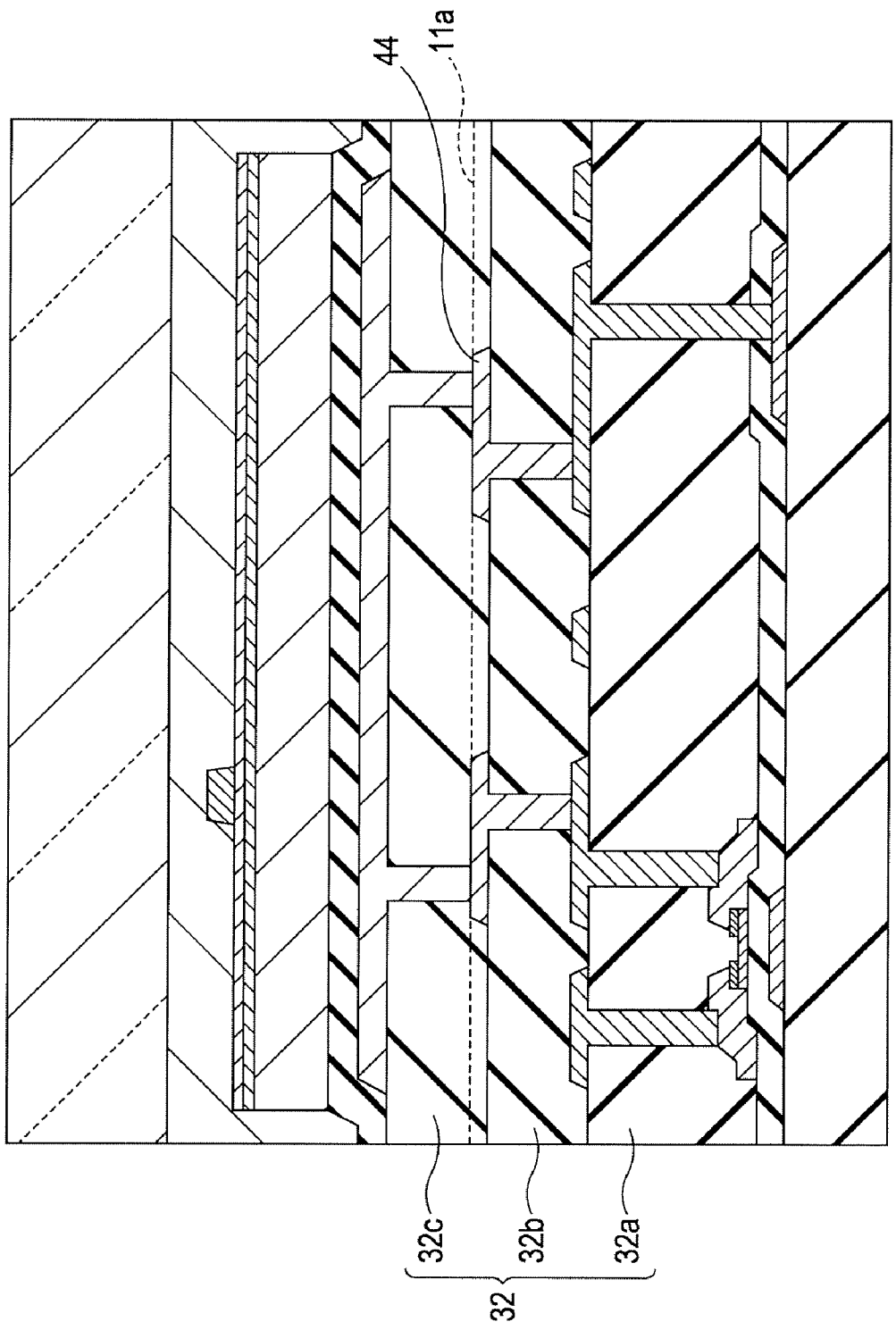
FIG. 9 is a cross-sectional view of a pixel having a different configuration from that in FIG. 2 according to the first embodiment.
Figure 10:
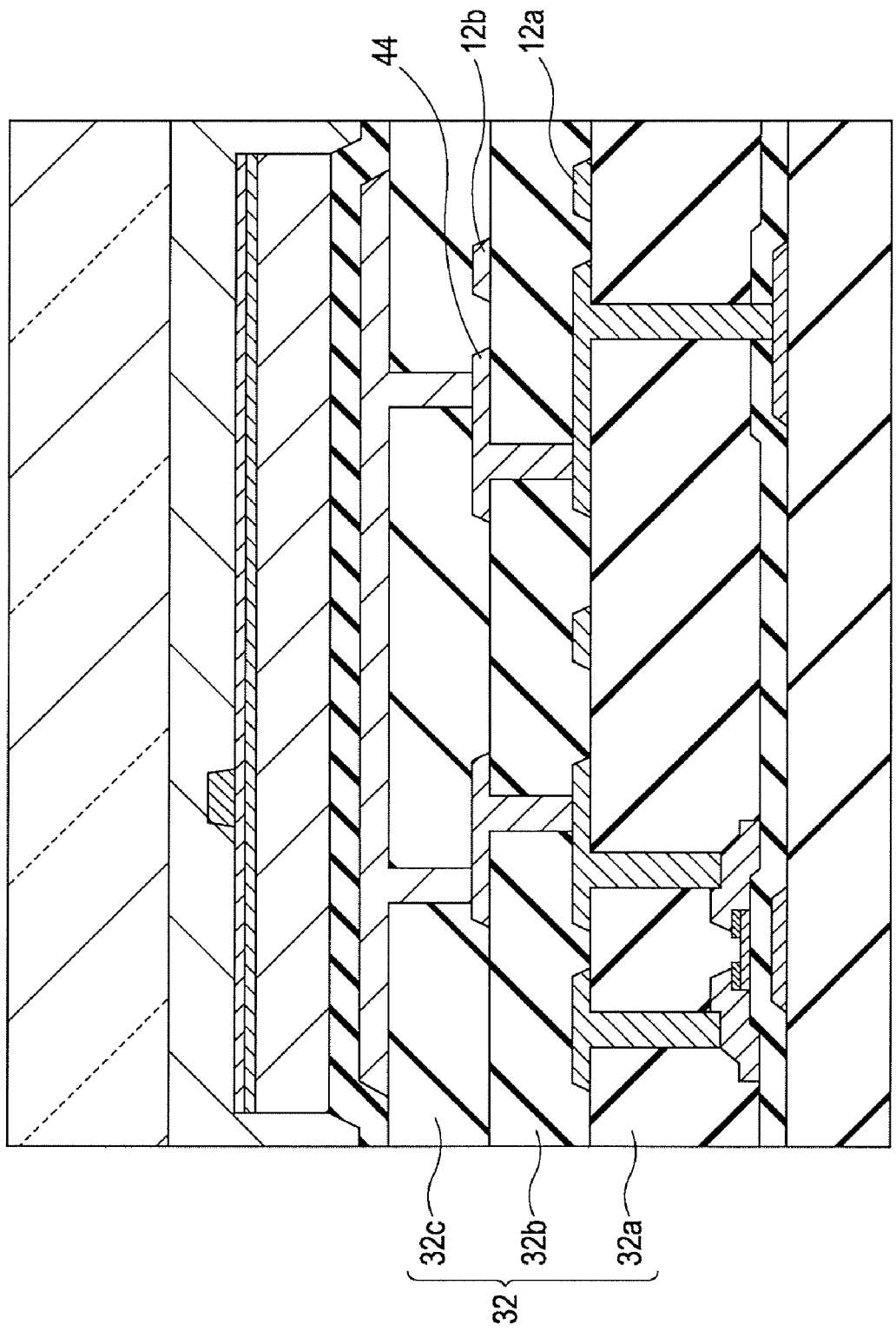
FIG. 10 is a cross-sectional view of a pixel having a different configuration from that in FIG. 9 according to the first embodiment.
Figure 11:
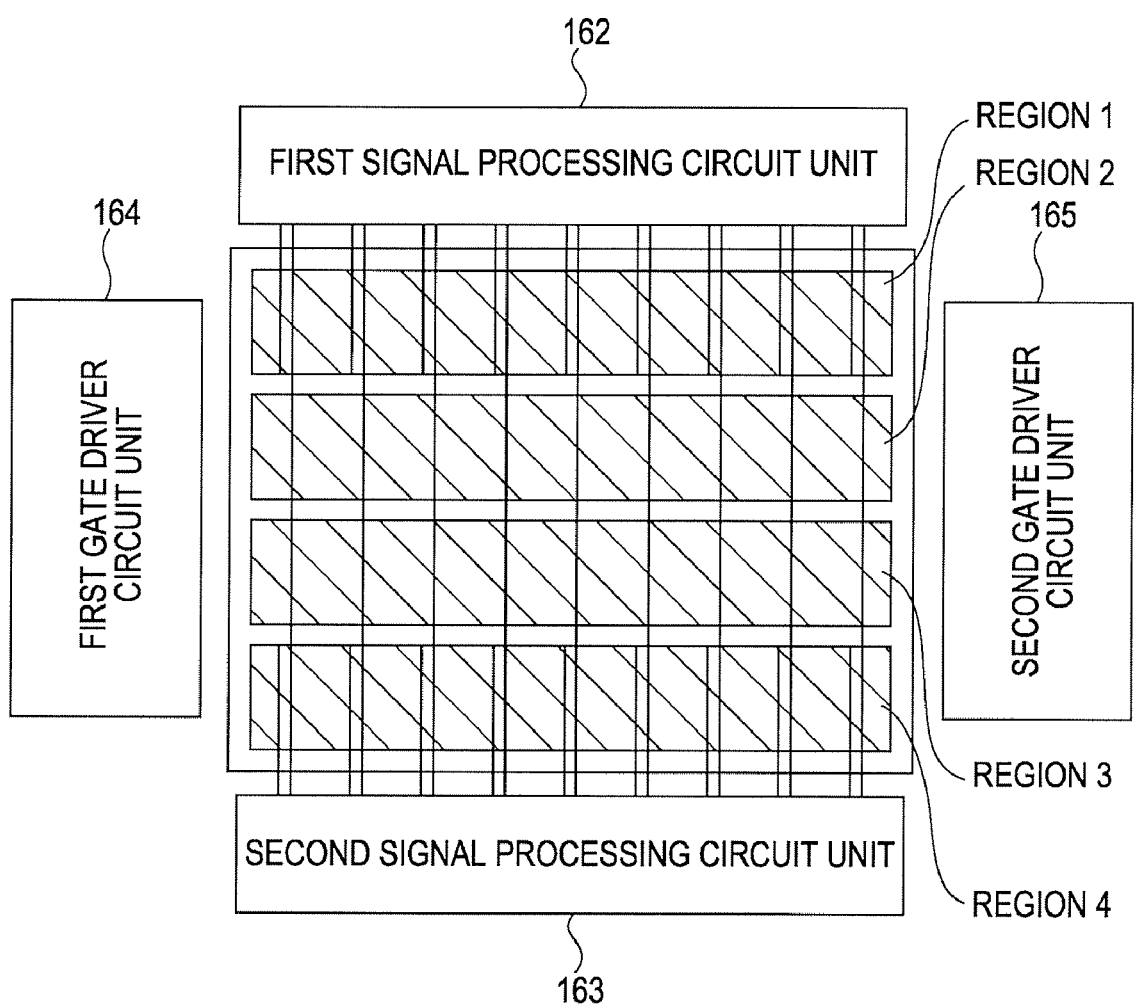
FIG. 11 is a schematic diagram that illustrates the relationship between a pixel area within a substrate and peripheral circuits in an imaging apparatus that includes pixels each illustrated in FIG. 10 according to the first embodiment.
Figure 12:
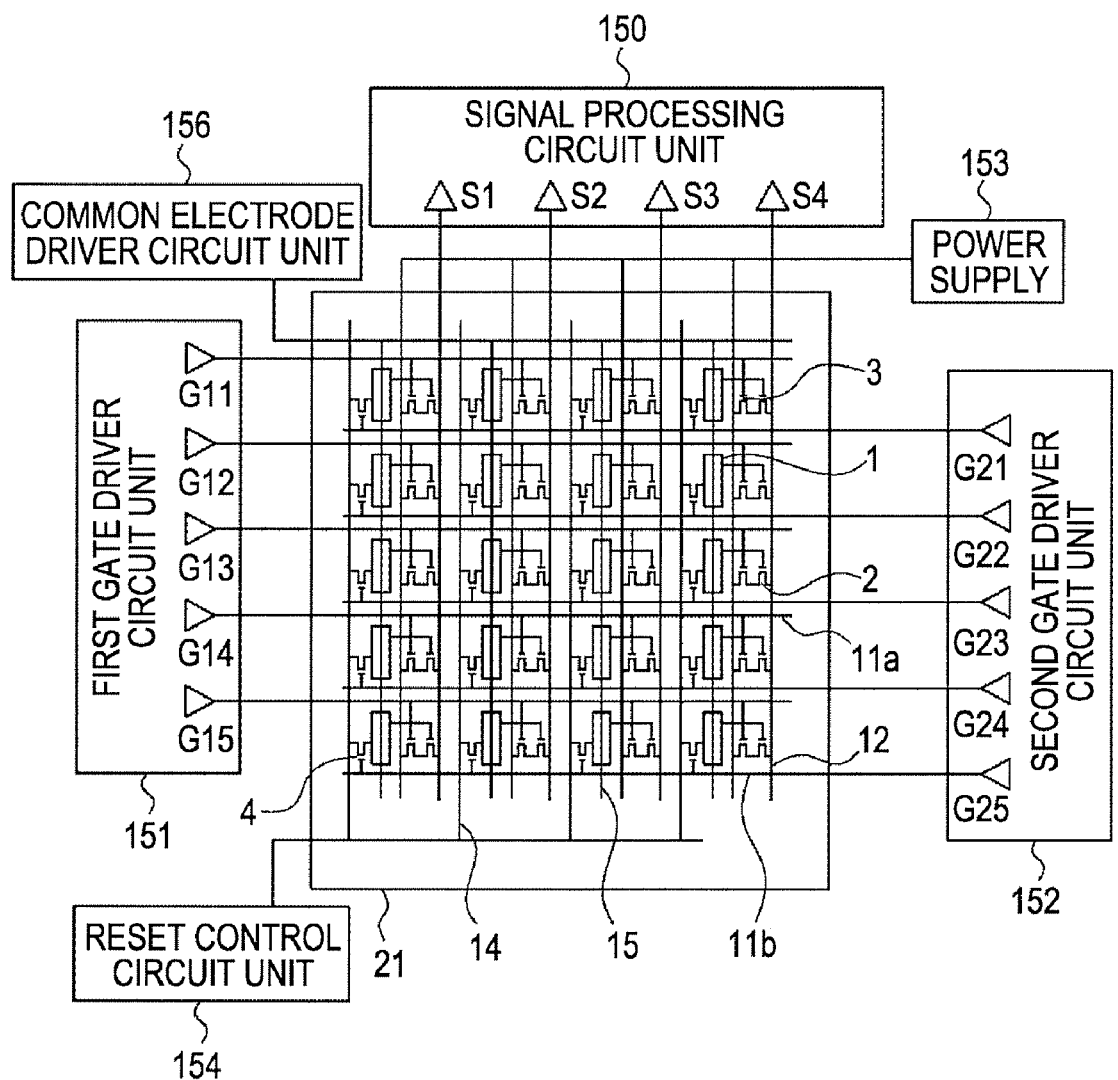
FIG. 12 is a schematic diagram of a simple equivalent circuit and peripheral circuits in an imaging apparatus according to the first embodiment.

FIGS. 1 to 12 show a first embodiment of the present invention. FIGS. 1, 7, and 8 are plan views of a pixel. FIGS. 2, 3, 9, and 10 are cross-sectional views of a pixel. FIG. 11 illustrates a pixel area and peripheral circuits. FIG. 12 illustrates a simple equivalent circuit diagram and peripheral circuits.

A first characteristic of the present embodiment is a laminated structure having a plurality of insulating layers disposed between a switching element and a conversion element and at least one of gate wiring and signal wiring being arranged in a region sandwiched between insulating layers. A second characteristic is that the switching element has a source-follower structure that has a plurality of thin-film transistors (TFTs) including a reading TFT electrically connected to the signal wiring and a selecting TFT electrically connected to power-supply wiring and the reading TFT. The first and second characteristics are common to all embodiments. The switching element can include a resetting TFT electrically connected to reset wiring. This is advantageous because electric charge within the conversion element can be reset.

Figure 22:
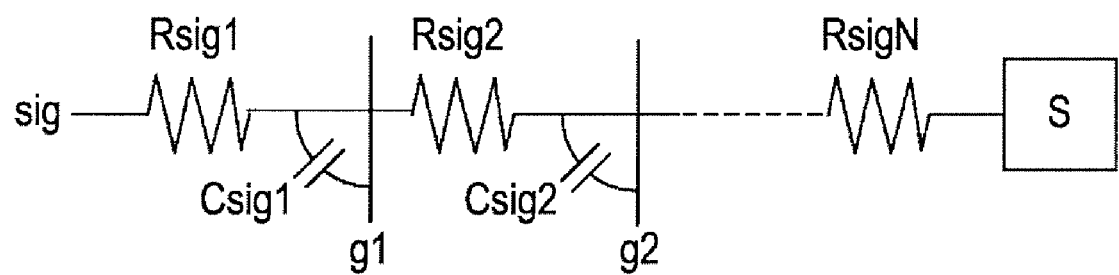
FIG. 22 illustrates a simple equivalent circuit diagram of one signal wiring.

FIG. 1 is a plan view of a single pixel according to the first embodiment of the present invention. The pixel includes a conversion element 1 and a plurality of TFTs (2, 3, and 4). Although not illustrated, any number of pixels can be arranged. For example, 2,000×2,000 pixels can be arranged. The pixels can be connected to wirings such that each wiring is shared by the pixels in the same row or column. Here, effects of a parasitic capacitance of one signal wiring sig will be described with reference to FIG. 22. Resistive components Rsig1, Rsig2, ..., RsigN are resistive components depending on the material of the signal wiring and the cross-sectional area and the length of the wiring. Parasitic capacitances Csig1, Csig2, ..., CsigN are parasitic capacitances of the signal wiring, including capacitances caused by gate wirings g1 and g2 intersecting the signal wiring. Reference numeral S indicates a signal processing circuit. An imaging apparatus that includes a plurality of pixels arranged on an insulation substrate with a large footprint, like the present invention, has wirings having a length of the order of 20 cm to 40 cm and a width of the order of 10 μm. Accordingly, effects of the parasitic capacitance thereof are larger than effects of the parasitic capacitance of a fine wiring having a width not exceeding 1 μm of a circuit formed on a semiconductor chip. Additionally, unlike a semiconductor chip, a capacitance caused by an electrode of a conversion element intersecting the signal wiring is also present. In an image apparatus, which transfers minute electric charges, when the resistance and/or capacitance of the signal wiring increase, noise tends to increase, and this leads to a decrease in the S/N ratio. For a source-follower conversion element, as described in the present embodiment, a signal to be transferred is amplified, so a sufficient transfer speed is required. Therefore, it is necessary to reduce the product of the resistance and the capacitance of the signal wiring (Rsig×Csig) being the time constant for driving at high speed. For a structure in which a gate insulating layer is disposed between the signal wiring and the gate wiring, one approach to reducing the parasitic capacitance produced at the intersection of the wirings is to increase the thickness of the gate insulating layer of a TFT, which typically has a thickness of approximately 0.1 μm. However, this approach is undesired because the ON characteristic of the TFT is reduced.

As illustrated in FIG. 1, a single pixel includes three TFTs consisting of a reading TFT 2, a selecting TFT 3 electrically connected to power-supply wiring 13 and the reading TFT 2, and a resetting TFT 4 electrically connected to reset wiring 14. In the following description, a source electrode and a drain electrode of a TFT are interchangeable, depending on the direction of an electric current.

A gate electrode 17 of the reading TFT 2 is connected to a first electrode of the conversion element 1, and the reading TFT 2 operates in accordance with the quantity of light or radiation incident on the conversion element 1. The first electrode of the conversion element 1 is a fifth conductive layer 51 being a lower electrode, which will be described below with reference to FIG. 3. A source electrode 18 of the reading TFT 2 and signal wiring 12 are connected to each other via a through hole 16. When the power is turned on, the selecting TFT 3 receives a voltage from the power-supply wiring 13 and supplies a voltage corresponding to a potential of the conversion element 1 to the signal wiring 12. A source electrode 18 of the selecting TFT 3 is connected to the power-supply wiring 13 via a though hole 16. The resetting TFT 4 is turned on after electric charge stored in the conversion element 1 is read out. In response to a voltage supplied from the reset wiring 14 (a reset voltage), electric charge in the conversion element 1 is reset. A source electrode 18 of the resetting TFT 4 is connected to the reset wiring 14 via a through hole 16.

The conversion element 1 is disposed above the TFTs 2, 3, and 4. The lower (first) electrode of the conversion element 1 is connected to the gate electrode 17 of the reading TFT 2 via a through hole 16. The lower (first) electrode of the conversion element 1 is connected to a drain electrode 19 of the resetting TFT 4 via a through hole 16. The lower (first) electrode of the conversion element 1 is the fifth conductive layer 51, which will be described below with reference to FIG. 3.

Figure 2:
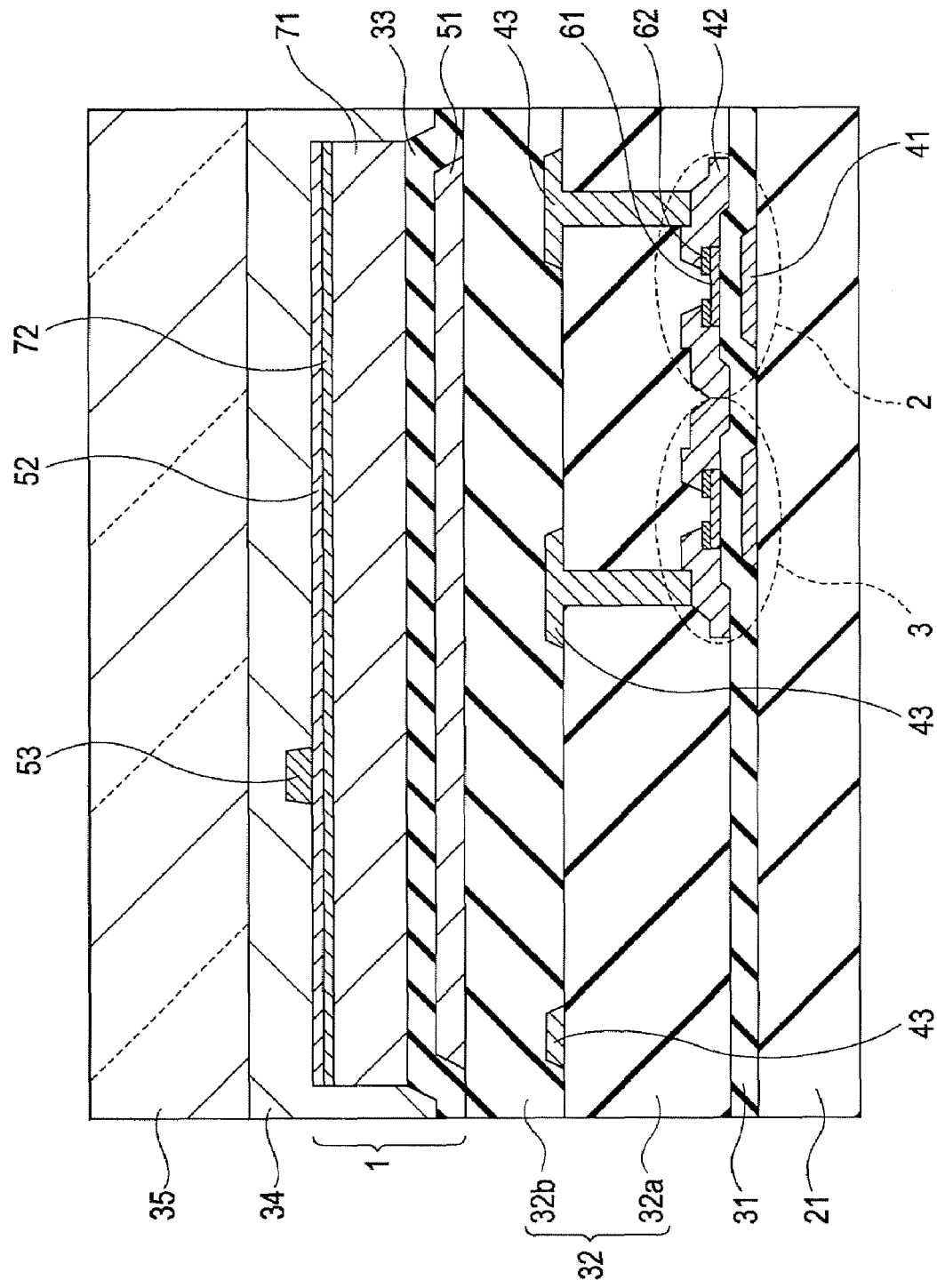
FIG. 2 is a cross-sectional view taken along the line II-II of FIG. 1.

FIG. 2 is a cross-sectional view taken along the line II-II of FIG. 1. Each of the reading TFT 2 and selecting TFT 3 illustrated in the drawing is a bottom-gate TFT using amorphous silicon and is disposed on an insulation substrate 21. Each of the reading TFT 2 and the selecting TFT 3 is composed of a first conductive layer 41 constituting the gate electrode, a first insulating layer 31 being a gate insulating layer, a first semiconductor layer 61, a first doped semiconductor layer 62, and a second conductive layer 42. First gate wiring 11a and second gate wiring 11b illustrated in FIG. 1 (not shown in FIG. 2) are disposed between the insulation substrate 21 and the first insulating layer 31. The first gate wiring 11a supplies a driving signal to the gate electrode 17 of the selecting TFT 3. The second gate wiring 11b supplies a driving signal to the gate electrode 17 of the resetting TFT 4.

The conversion element 1 is an MIS conversion element composed of the fifth conductive layer 51, an insulating layer 33 of the conversion element 1, a second semiconductor layer 71, a second doped semiconductor layer 72 being an ohmic contact layer, and a sixth conductive layer 52 being a transparent electrode layer. The fifth conductive layer 51 is the lower (first) electrode of the conversion element 1. A seventh conductive layer 53 being bias wiring is disposed to apply a voltage to the conversion element 1. The seventh conductive layer 53 may be omitted if the sixth conductive layer 52 also serves as the bias wiring. The conversion element 1 is overlaid with a protective layer 34 and a scintillator layer 35.

A second insulating film 32 is disposed between the conversion element 1 and the plurality of TFTs 2, 3, and 4 and is composed of a laminated film including a plurality of insulating layers 32a and 32b. The signal wiring 12, the reset wiring 14, and the power-supply wiring 13 are composed of a third conductive layer 43 disposed between the insulating layers of the second insulating film 32. The second insulating film 32 can be composed of a material that has a low dielectric constant and that allows the second insulating film 32 to have a large film thickness. The second insulating film 32 in the present embodiment is a flat organic insulating film. Such a configuration is advantageous to reduction in capacitance between a TFT having a large area in a pixel, in particular, a channel region, a source electrode, and a drain electrode, and wirings and a conversion element disposed thereabove. In the case where a plurality of TFTs is disposed, the number of wirings is large and the number of intersections of wirings is large. The above-described configuration is advantageous to a reduction in the total capacitance between the wirings. In addition, it is advantageous especially when the line width of wiring disposed above the TFTs is increased such that the wirings cover the TFTs to actively reduce wiring resistance. As a result, the capacitance between the wirings can be reduced, and wiring illustrated in FIG. 1 can be formed so as to have a practical line width. In this drawing, the line width is not an extremely large size. However, even if the signal wiring, the reset wiring, and the power-supply wiring overlap the gate electrode of a TFT or have a larger width, an increase in the capacitance can be suppressed because the second insulating film is disposed between the wiring and the gate electrode. Because the above-described configuration enables a reduction in the resistance and capacitance of the wiring, a line time constant being the product of the resistance and the capacitance can be reduced. A reduction in the resistance and the capacitance of the signal wiring results in an image with reduced noise. A reduction in the time constant of the reset wiring and that of the power-supply wiring results in a high-quality image that has no two-dimensional artifact. The same applies to the gate wiring. Even when the gate wiring is disposed as the third conductive layer and the signal wiring, the reset wiring, and the power-supply wiring are disposed as the first conductive layer or the second conductive layer so as to markedly overlap the TFTs and the wirings, the capacitance and the resistance can be reduced due to advantageous effects of the second insulating film disposed therebetween. As a result, the line time constant of the gate wiring can be reduced, thus enabling an increase in the driving speed. Therefore, in video shooting, for example, high-quality moving images that do not cause discomfort can be provided.

The second insulating film 32 can be composed of an acrylic, polyimide, or siloxane film that has high heat resistance, in consideration of a process of manufacturing a conversion element to be stacked thereon. Because an organic film can be easily formed so as to have a large thickness, the thickness of each of the plurality of insulating layers of the second insulating film 32 can be between 1 μm and 10 μm, inclusive, preferably, between 2 μm and 10 μm, inclusive, and most preferably, between 3 μm and 10 μm, inclusive. If the total thickness of the plurality of insulating layers of the insulating film 32 exceeds 20 μm, a large step height undesirably forms a region where the adhesion properties of a photoresist are poor when the insulating film is coated with the photoresist. In addition, because the thickness of the photoresist is large only at a depression in the step portion, not all of the photoresist is completely exposed in the exposure and development processes performed thereafter, so an undesirable pattern residue is present. To avoid this, it is necessary for the plurality of insulating layers to have a total thickness of 20 μm or less. Transparency is not important to the second insulating film 32 because radiation is incident on a side of the conversion element 1 remote from the insulation substrate 21. Therefore, the second insulating film 32 can have no optical transparency as long as it has heat resistance. For this reason, the organic film can contain, for example, a photosensitive material. In this case, the second insulating film 32 can be processed by photolithography, thus enabling a simplification of the manufacturing process. In the case of using an inorganic film as the second insulating film 32, it can be composed of a chemical-vapor deposition (CVD) film including silicon oxide ($SiO_2$) or tetraethyl orthosilicate (TEOS), and each layer of the second insulating film 32 can have a thickness of 1 μm or more.

The source electrode, drain electrode, and channel region of each TFT are directly covered with the second insulating film 32. However, an inorganic insulating layer serving as a protective film for the TFT may be disposed between the TFT and the second insulating film 32. In this case, insulation properties can be further improved, and adverse effects on properties of impurities can be reduced. The inorganic insulating film serving as a protective film can protect the TFT with a small thickness. As a result, the second insulating film 32 is necessary to sufficiently reduce the capacitance.

Figure 3:
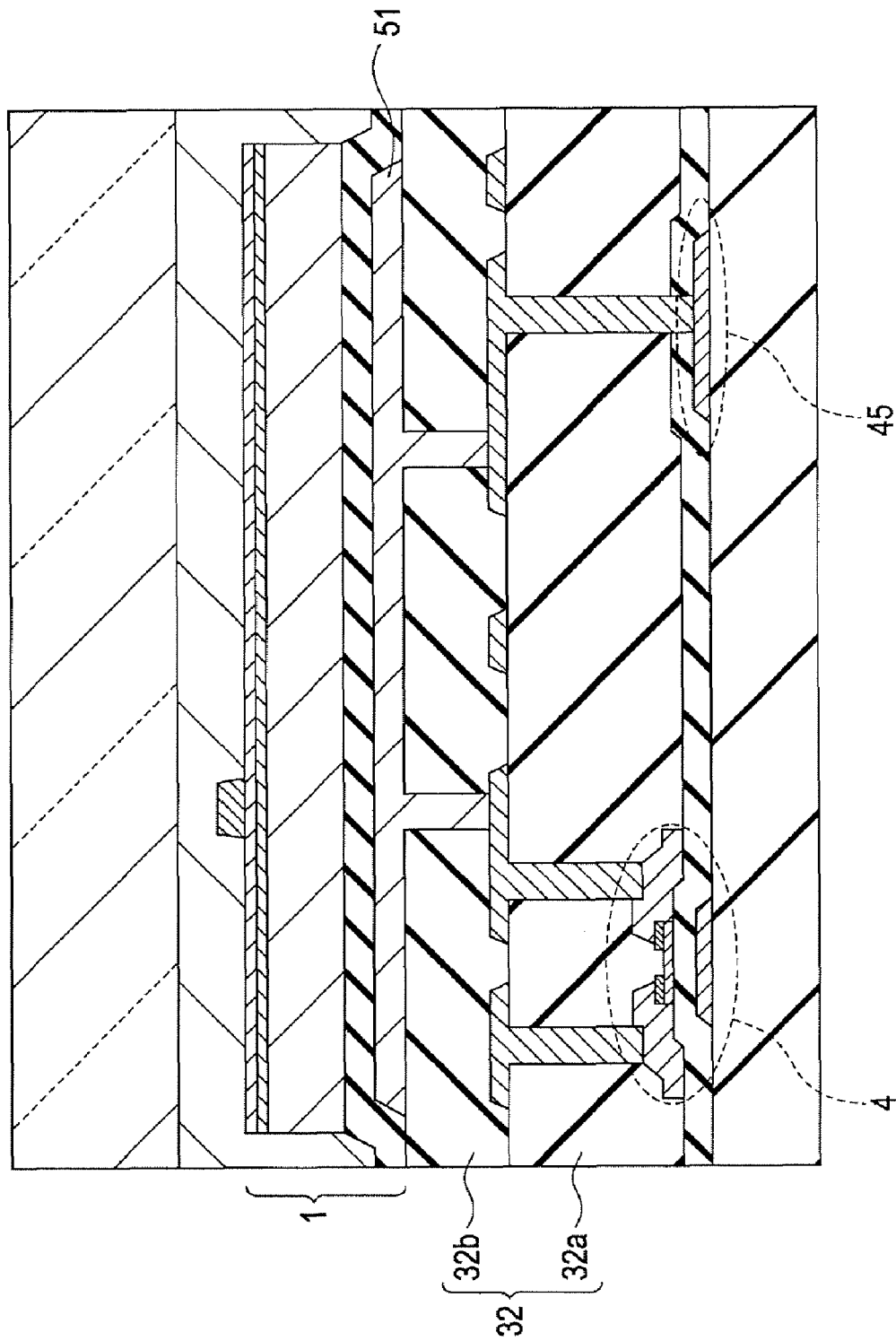
FIG. 3 is a cross-sectional view taken along the line III-III of FIG. 1.

FIG. 3 is a cross-sectional view taken along the line III-III of FIG. 1.

The resetting TFT 4 illustrated in the drawing is a bottom-gate TFT using amorphous silicon and is disposed on the insulation substrate. A contact portion 45 is a part of the same first conductive layer 41 as that being the gate electrode 17 of the reading TFT 2. The resetting TFT 4 and the contact portion 45 are connected to the fifth conductive layer 51, which is the lower (first) electrode of the conversion element 1, via respective through holes 16. The position of each of the through holes 16 in the insulating layer 32a of the second insulating film 32 is not aligned with the position of each of the through holes 16 in the insulating layer 32b. This can prevent an unstable process caused by formation of a second though hole immediately above a first though hole that may have a stepped portion formed at its central part depending on conditions when a conductive layer is formed over the first though hole formed by lithography.

Figure 4:
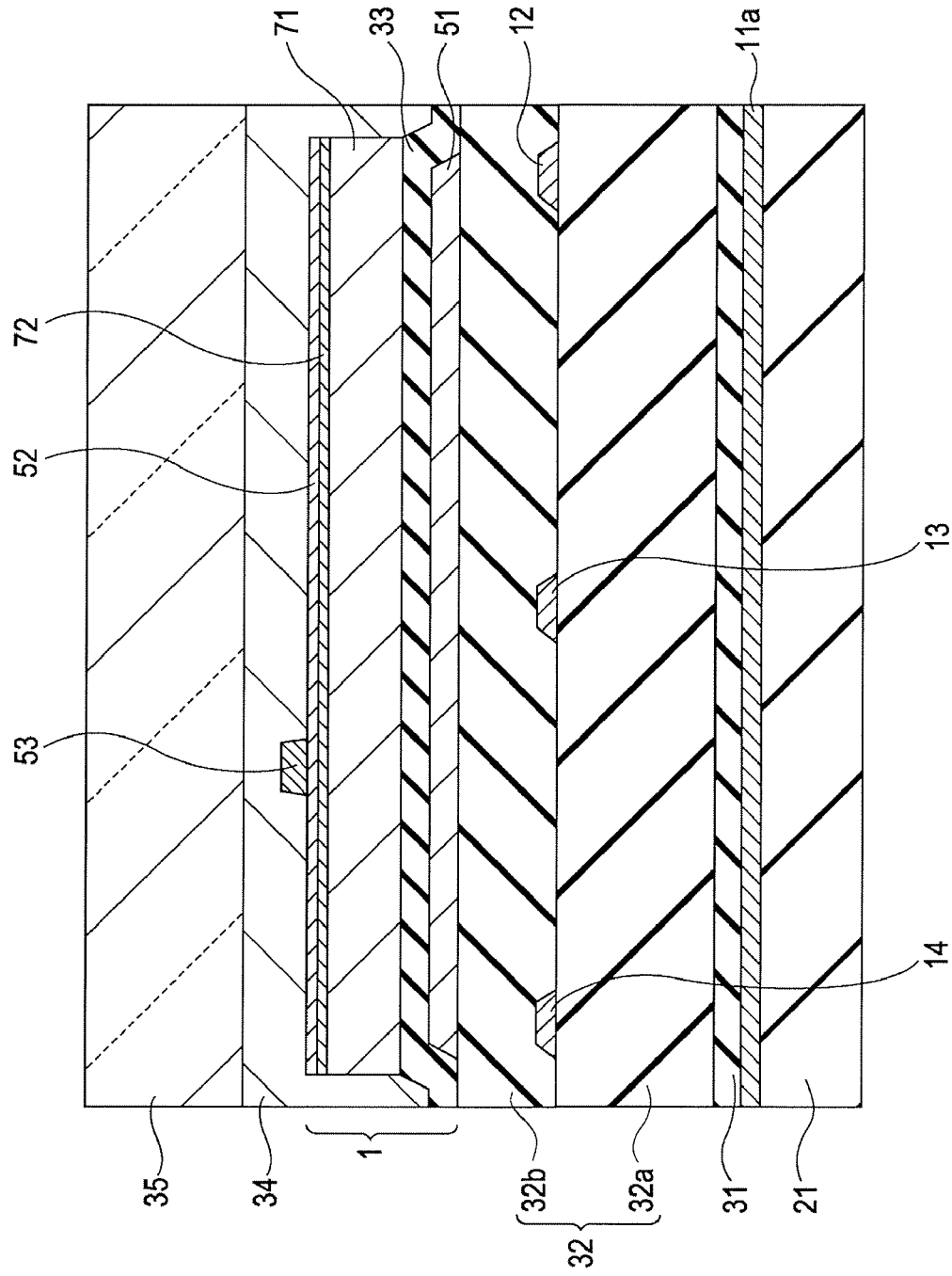
FIG. 4 is a cross-sectional view taken along the line IV-IV of FIG. 1.

FIG. 4 is a cross-sectional view taken along the line IV-IV of FIG. 1.

The first gate wiring 11a is disposed on the insulation substrate 21. The first insulating layer 31 and the insulating layer 32a of the second insulating film 32 are disposed between the first gate wiring 11a and the signal wiring 12, the power-supply wiring 13, and the reset wiring 14. Since the insulating layer 32a, which can have a thickness larger than the thickness of the first insulating layer 31 being a gate insulating layer, is disposed between the wirings, the capacitance of the wirings can be reduced.

FIG. 5 is a plan view of a pixel having a different configuration from that in FIG. 1 in the imaging apparatus according to the first embodiment.

The pixel illustrated in FIG. 5 differs from that in FIG. 1 in that the first gate wiring 11a is connected to the gate electrode 17 of the selecting TFT 3 via the corresponding through hole 16. The second gate wiring 11b is also connected to the gate electrode 17 of the resetting TFT 4 via the corresponding through hole 16.

FIG. 6 is a cross-sectional view take along the line VI-VI of FIG. 5.

The first gate wiring 11a is disposed between the insulating layers 32a and 32b of the second insulating film 32. The signal wiring 12, the power-supply wiring 13, and the reset wiring 14 are disposed between the first insulating layer 31 and the insulating layer 32a of the second insulating film 32. Also in a configuration illustrated in FIGS. 5 and 6, since the insulating layer 32a, which can have a thickness larger than the thickness of the first insulating layer 31 being a gate insulating layer, is disposed between the wirings, the capacitance of the wirings can be reduced.

FIG. 7 is a plan view of a pixel in an imaging apparatus according to the first embodiment. This pixel has a different configuration from that illustrated in FIG. 1.

The pixel illustrated in FIG. 7 differs from that in FIG. 1 in that the line width of the signal wiring is larger. The imaging apparatus can reduce noise by reducing the wiring resistance of the signal wiring and thus improve the S/N ratio. When the line width of the signal wiring is increased in known apparatuses, the wiring resistance can be reduced, but it may result in deterioration in the S/N ratio because the wiring capacitance is increased. In contrast, as illustrated in FIGS. 2 and 3, when the signal wiring is disposed between the insulating layers of the second insulating film 32, the wiring resistance can be reduced without an increase in the capacitance because the signal wiring is not capacitively coupled to the electrodes of the TFTs, and this results in an improvement in the S/N ratio of the imaging apparatus. In particular, the interlayer insulating film can be a low-dielectric film having a large thickness. A metal film that includes the signal wiring can have a larger thickness. In this case, by use of a planarizing interlayer insulating film formed on the metal film, the metal film can be sufficiently covered with the interlayer insulating film and can have no stepped portion. This can prevent a break in wiring that is to be formed thereafter, as well as adverse effects on insulation properties of an insulating film that is to be formed thereafter.

FIG. 8 is a plan view of a pixel in the imaging apparatus according to the first embodiment. This pixel has a different configuration from that illustrated in FIG. 1.

The pixel illustrated in FIG. 8 differs from that in FIG. 1 in that the pixel includes a storage capacitor that stores electric charge generated in the conversion element.

The storage capacitor 81 includes a first electrode that receives ground potential and a second electrode electrically connected between the conversion element 1 and the reading TFT 2. The first electrode is connected to ground wiring shared by an adjacent pixel. The first electrode may be connected to the reset wiring 14, bias wiring 15, or power-supply wiring 13, instead of the ground wiring. The second electrode is composed of the same conductive layer as that being the gate electrode 17 of the reading TFT 2.

The storage capacitor 81 can be arranged within the pixel without causing an increase in the wiring capacitance because the second insulating film is disposed between the electrodes of the storage capacitor 81 and the signal wiring 12, reset wiring 14, bias wiring 15, and power-supply wiring 13. As a result, noise can be reduced, and the S/N ratio can be improved.

FIG. 9 is a cross-sectional view of a pixel in the imaging apparatus according to the first embodiment. This pixel has a different configuration from that illustrated in FIG. 2.

The pixel illustrated in FIG. 9 differs from that in FIG. 2 in that the second insulating film is composed of a three-layer laminated structure.

FIG. 9 is a cross-sectional view taken along the line IX-IX of FIG. 1. The first gate wiring 11a connected to the selecting TFT 3 is disposed between the insulating film 32b and an insulating film 32c of the second insulating film 32. The first gate wiring 11a is composed of a fourth conductive layer 44. Such a configuration enables a reduction in the wiring capacitance.

FIG. 10 is a cross-sectional view of a pixel in the imaging apparatus according to the first embodiment. This pixel has a different configuration from that illustrated in FIG. 9.

The pixel illustrated in FIG. 10 differs from that in FIG. 9 in that the gate wiring is composed of the first conductive layer, as in the case of FIG. 2, and the signal wiring is disposed at two locations between layers of the second insulating film.

FIG. 10 is a cross-sectional view taken along the line X-X of FIG. 1. Signal wiring 12a is disposed between the insulating layers 32a and 32b of the second insulating film 32. Signal wiring 12b is disposed between the insulating layers 32b and 32c of the second insulating film 32. Such a configuration enables a reduction in the wiring capacitance and also arrangement of two reading routes. As a result, a signal of two pixels arranged in, for example, the orientation of rows can be transferred.

FIG. 11 is a schematic diagram that illustrates the relationship between a pixel area within a substrate and peripheral circuits in an imaging apparatus that includes pixels each illustrated in FIG. 10.

FIG. 11 illustrates a connection state of an area in which conversion elements are arranged within the substrate to signal processing circuit units and gate driver circuit units disposed in the vicinity of the substrate. FIG. 11 illustrates a different configuration of the imaging apparatus in which the conversion elements each shown in FIG. 10 are divided into a plurality of regions and each region has signal wiring dedicated thereto.

In FIG. 11, the conversion elements arranged within the substrate are divided into four regions of regions 1 to 4. Each region has signal wiring dedicated thereto. A first signal processing circuit unit 162 capable of capturing a signal from the upper two regions and a second signal processing circuit unit 163 capable of capturing a signal from the lower two regions are disposed outside the substrate. In addition, a first gate driver circuit unit 164 and a second gate driver circuit unit 165 for controlling the gate electrodes arranged in the regions are disposed. Although not illustrated, a common electrode driver circuit unit and a power supply for applying a voltage to the conversion elements are arranged in at least one of the signal processing circuit units 162 and 163 and the gate driver circuit units 164 and 165.

By division of a pixel area broadly into four regions, the number of TFTs connected to a single signal wiring can be reduced to a quarter. This can reduce, in particular, the capacitance formed between the source and gate electrodes of a TFT, thus enabling a reduction in the total capacitance of the signal wiring. In this case, for example, wiring routed from the region 2 to the first signal processing circuit unit 162 can have a reduced capacitance in at least a section passing through the region 1 by being sandwiched between organic layers being insulating layers even when the conversion element is disposed thereabove. Therefore, the total capacitance of the signal wiring can be reduced to a small amount while at the same time a large aperture ratio of the conversion element is maintained. When one gate wiring being selected from each of the four regions, i.e., four gate wirings in total, are driven at the same time such that signals are simultaneously transmitted to the signal processing circuits, it is possible to drive the imaging apparatus at high speed.

The first gate driver circuit unit 164 and the second gate driver circuit unit 165 may be connected to each other with the gate wiring arranged within the substrate. The gate wiring may be divided into left and right portions at the center.

FIG. 12 illustrates a simple equivalent circuit diagram of an imaging apparatus that includes a panel having pixels each shown in FIG. 1 and peripheral circuits. The pixels each having the conversion element 1 and the plurality of TFTs (2, 3, and 4) are arranged in a matrix on the insulation substrate 21. The signal wirings 12 and the gate wirings 11a and 11b are provided so as to correspond to the number of columns and the number of rows, respectively. The plurality of TFTs includes the reading TFT 2 used for reading a signal corresponding to an electric charge obtained by conversion performed by the conversion element 1, the selecting TFT 3 used for selecting a pixel to be read, and the resetting TFT 4 used for resetting the electric charge that remains in the conversion element 1 after reading. The reading TFT 2 is a source-follower TFT that has a gate electrode connected to the conversion element 1. A signal processing circuit unit 150 processes a signal transferred via the signal wiring 12. A gate driver circuit includes a first gate driver circuit unit 151 and a second gate driver circuit unit 152. The first gate driver circuit unit 151 and the second gate driver circuit unit 152 are connected to the first gate wiring 11a and the second gate wiring 11b, respectively, to transfer a driving signal. The first gate driver circuit unit 151 controls the selecting TFT 3. The second gate driver circuit unit 152 controls the resetting TFT 4. A common electrode driver circuit unit 156 supplies a bias voltage to a bias wiring 15. A power supply 153 supplies a voltage or a current to the power-supply wiring 13. A reset control circuit unit 154 supplies a voltage to the reset wiring 14. An imaging apparatus in which the source-follower reading TFT 2 and the selecting TFT 3 are interchanged in terms of connection relationship, the source electrode 18 of the selecting TFT 3 is connected to the drain electrode 19 of the reading TFT 2, and the drain electrode 19 of the selecting TFT 3 is connected to the signal wiring 12 operates in the same manner.

As described above, for an imaging apparatus that includes a conversion element and a plurality of TFTs, a configuration in which at least one insulating layer included in a second insulating film is sandwiched between intersecting wirings arranged in the orientation of columns or rows enables a reduction in the wiring capacitance. In addition, a high degree of flexibility in layout allows the wiring to have a large line width, thus resulting in a reduction in the resistance. As a result, even when the number of wirings is increased, the occurrence of poor characteristics relating to an increase in the wiring capacitance or resistance can be reduced. The above-described configurations can be combined in any combination.

Second Embodiment

Figure 13:
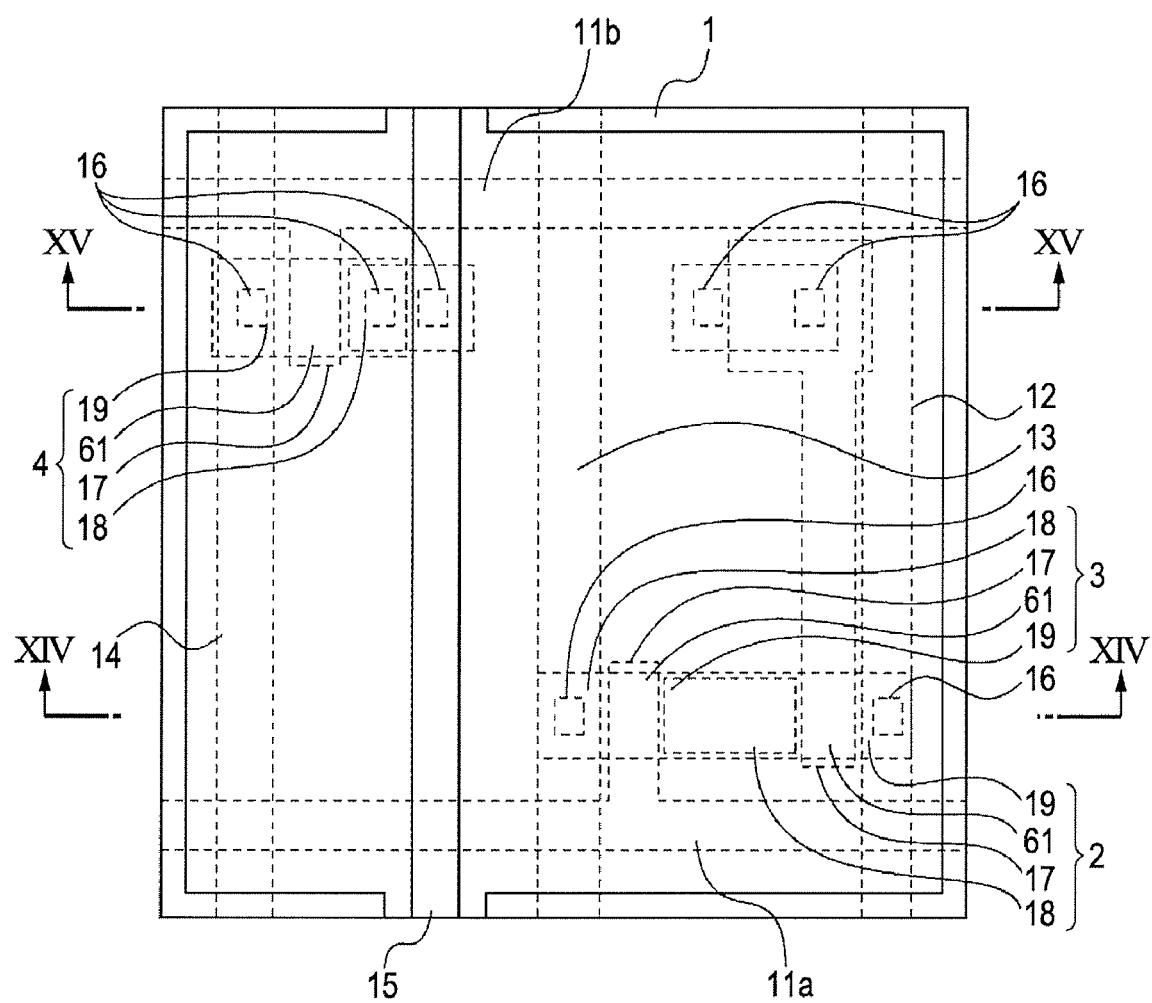
FIG. 13 is a plan view of a pixel according to a second embodiment of the present invention.
Figure 14:
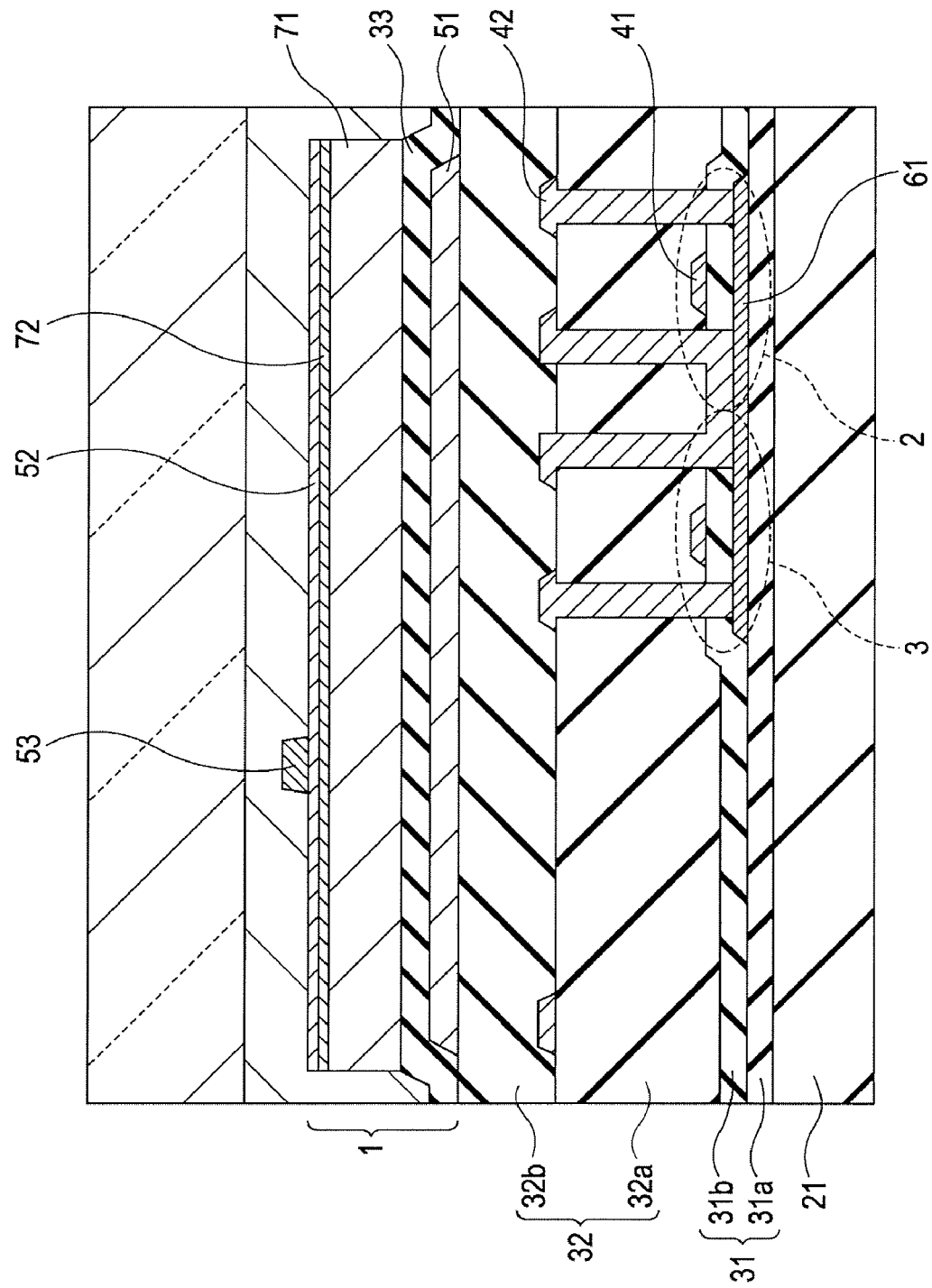
FIG. 14 is a cross-sectional view taken along the line XIV-XIV of FIG. 13.
Figure 15:
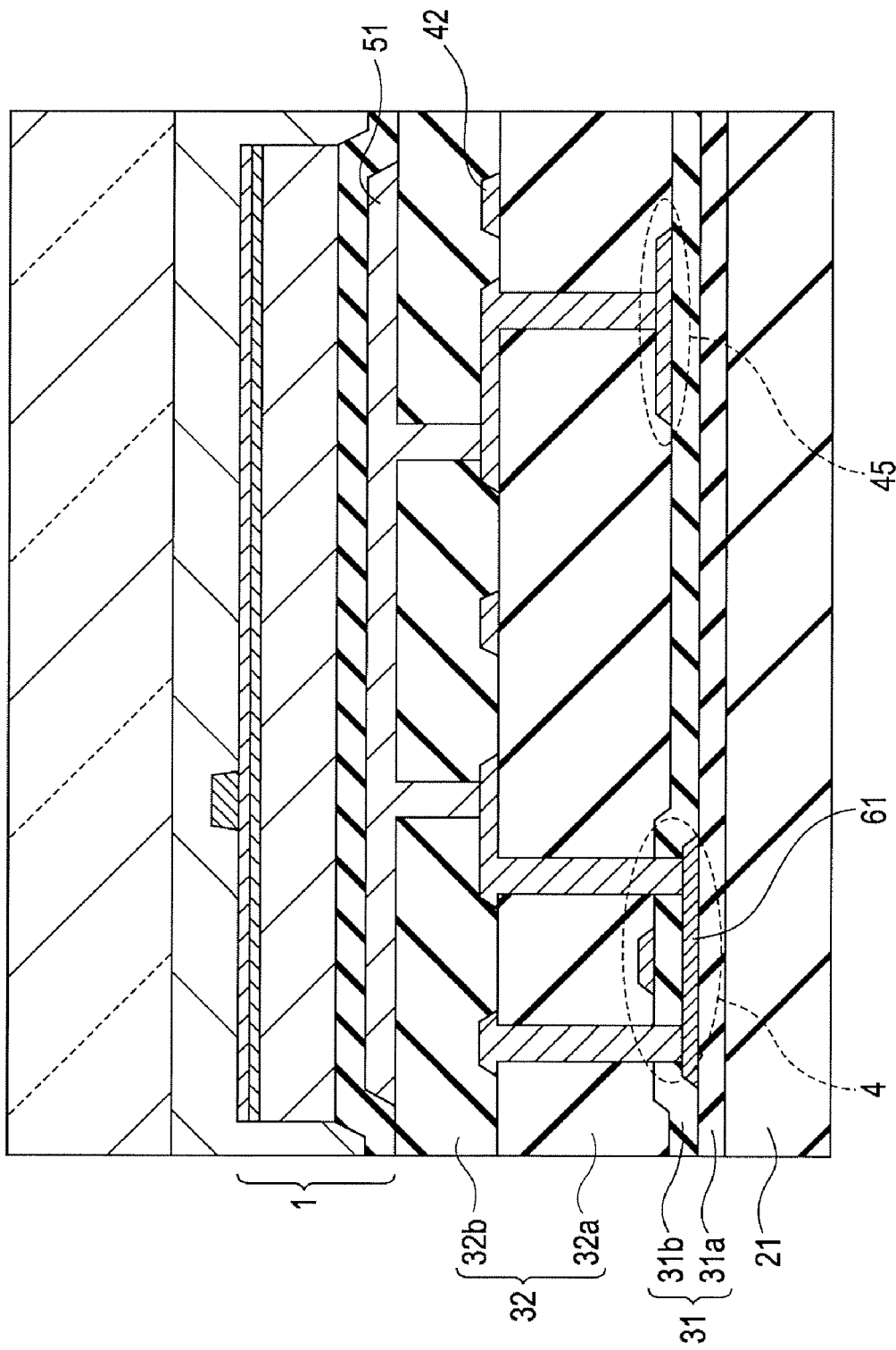
FIG. 15 is a cross-sectional view taken along the line XV-XV of FIG. 13.
Figure 16:
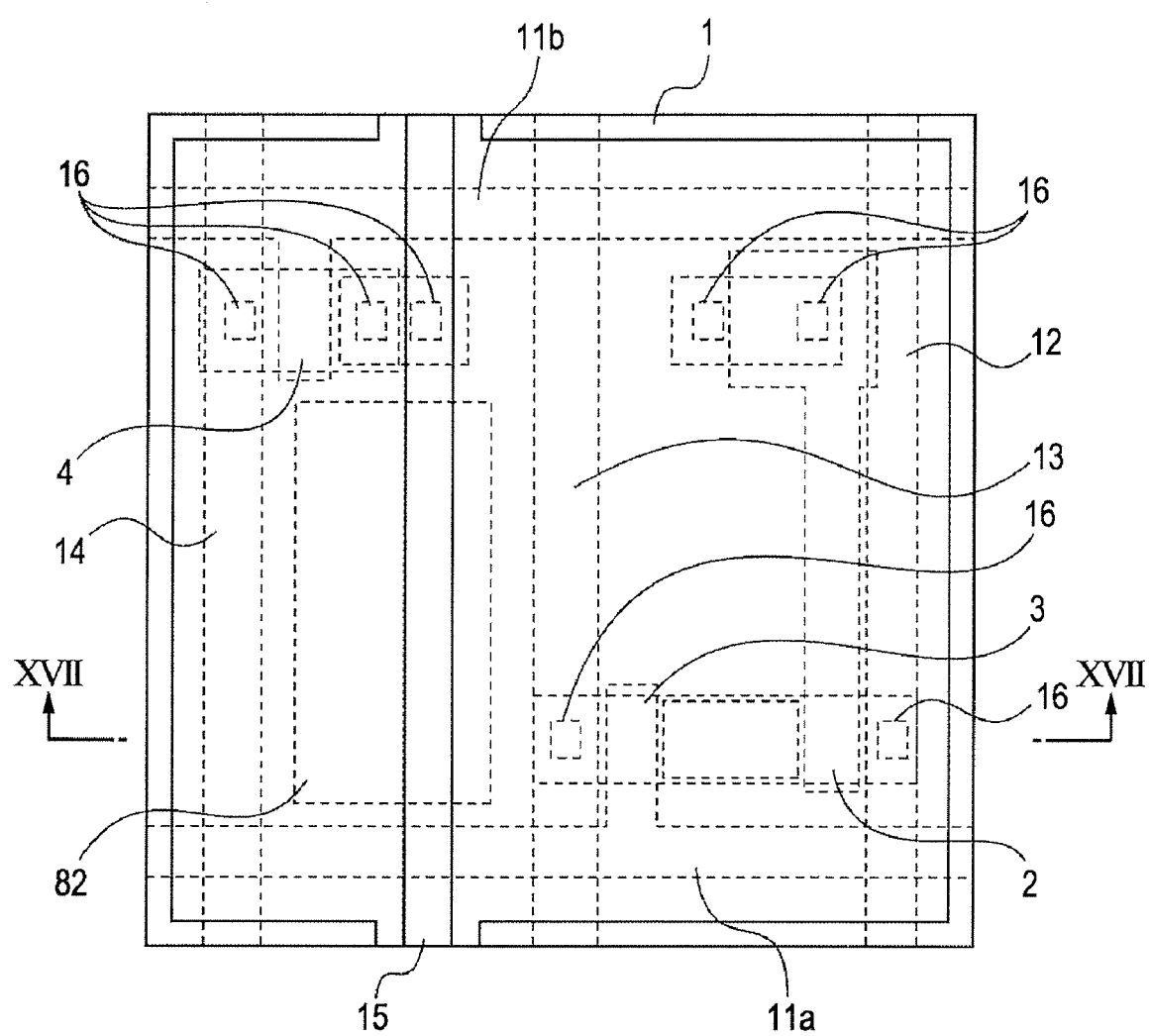
FIG. 16 is a plan view of a pixel having a different configuration from that in FIG. 13 according to the second embodiment.
Figure 17:
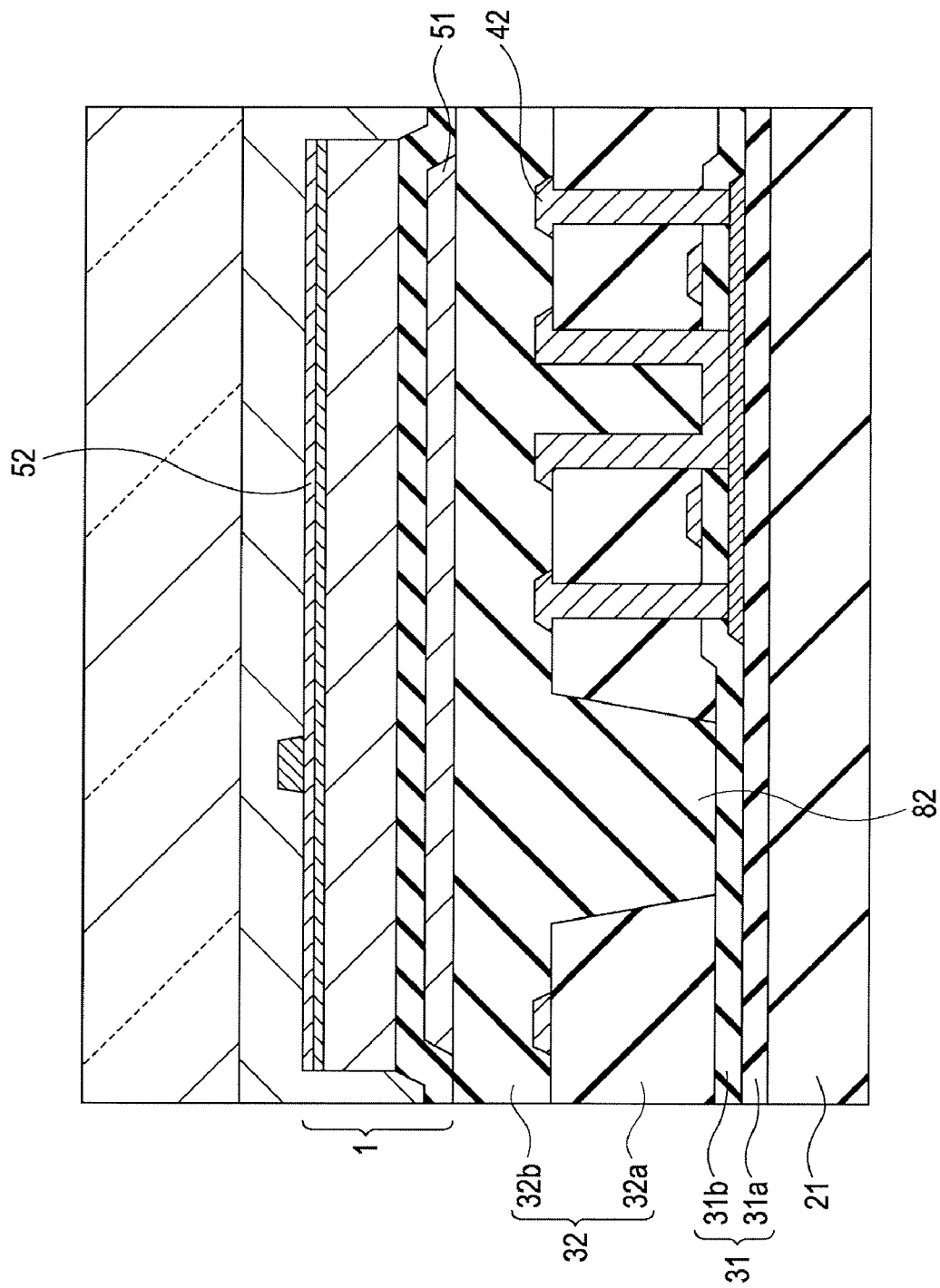
FIG. 17 is a cross-sectional view taken along the line XVII-XVII of FIG. 16.
Figure 18:
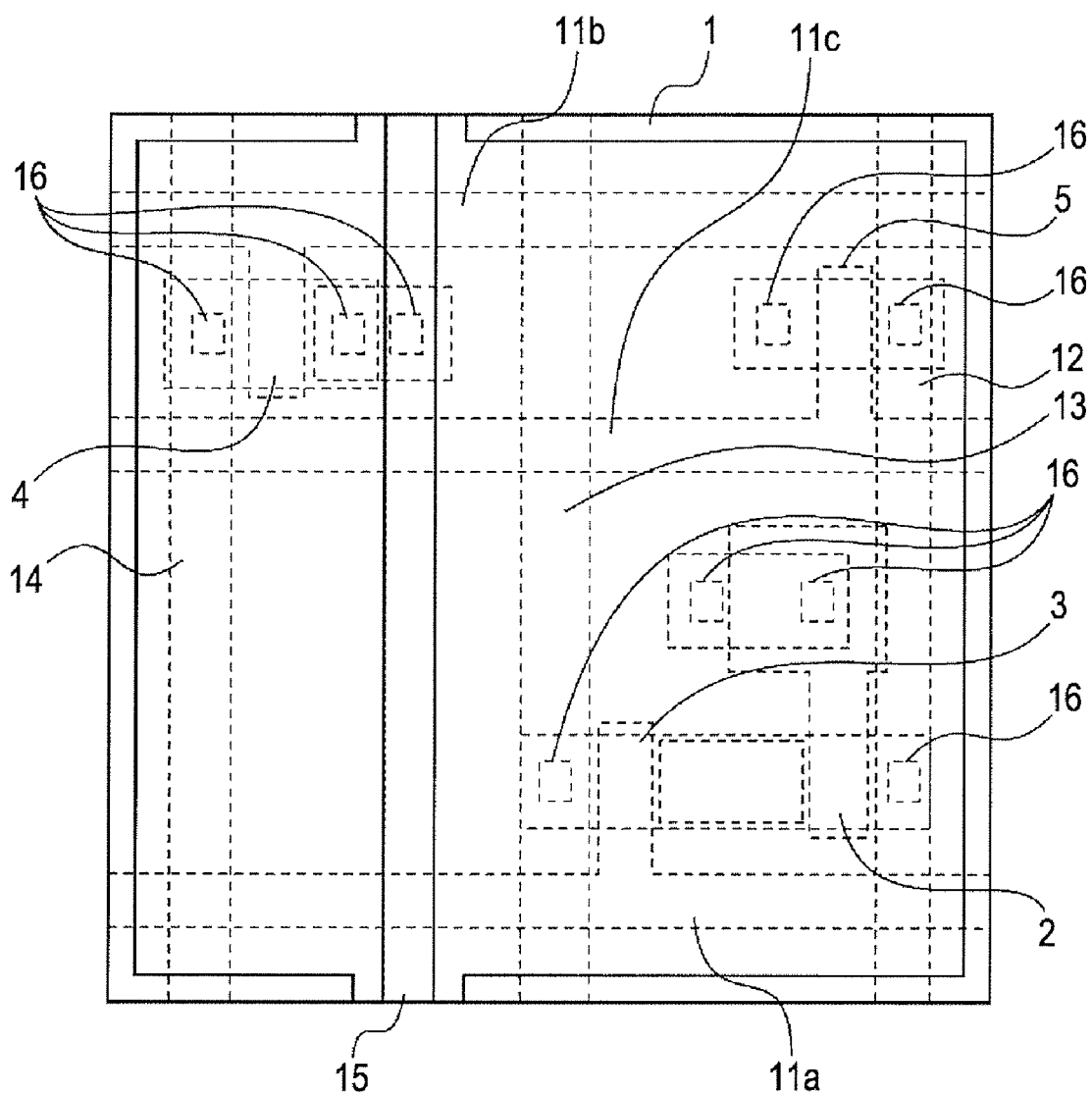
FIG. 18 is a plan view of a pixel having a different configuration from that in FIG. 13 according to the second embodiment.
Figure 19:
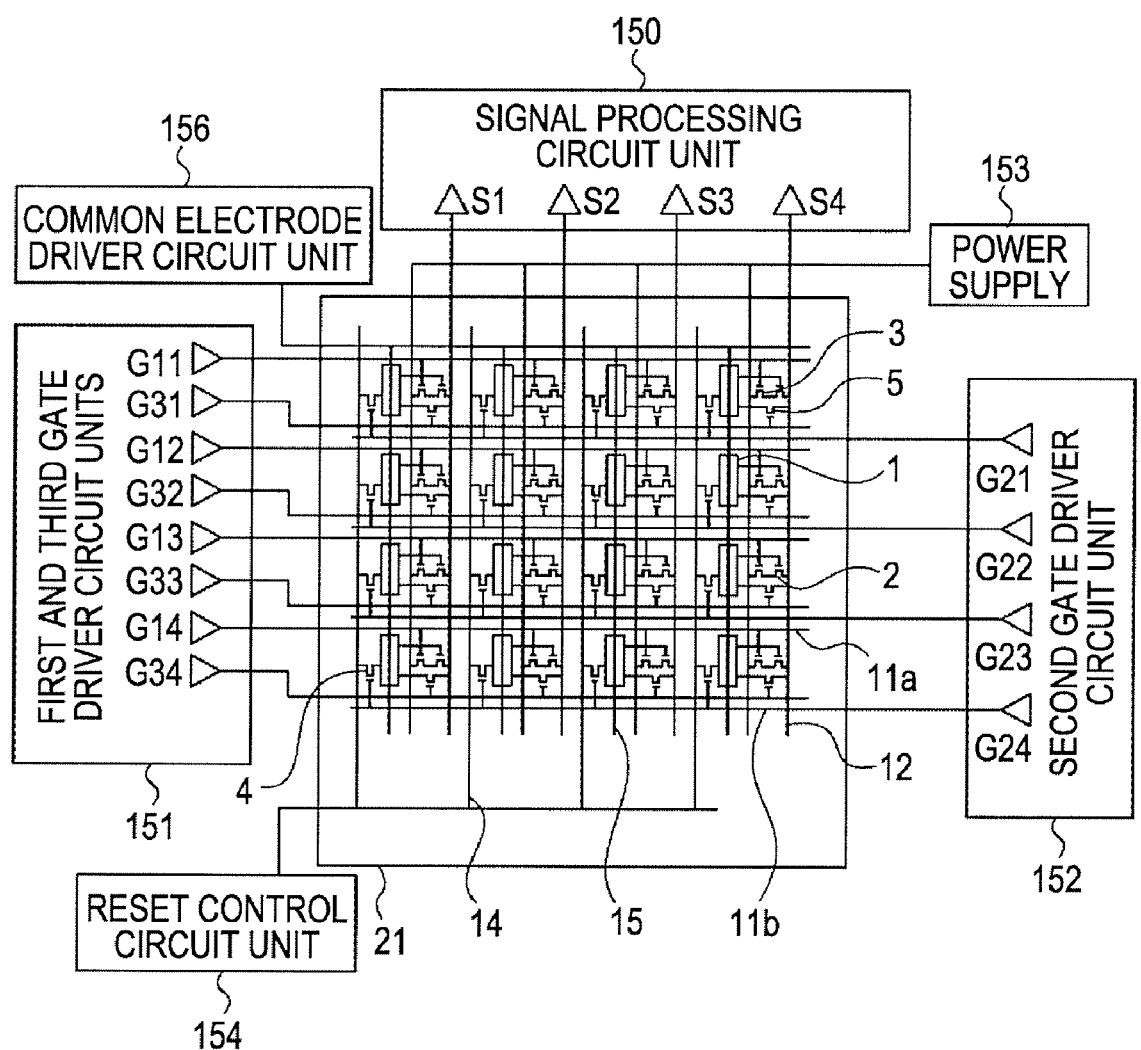
FIG. 19 is a schematic diagram of a simple equivalent circuit and peripheral circuits in an imaging apparatus according to the second embodiment.
Figure 20:
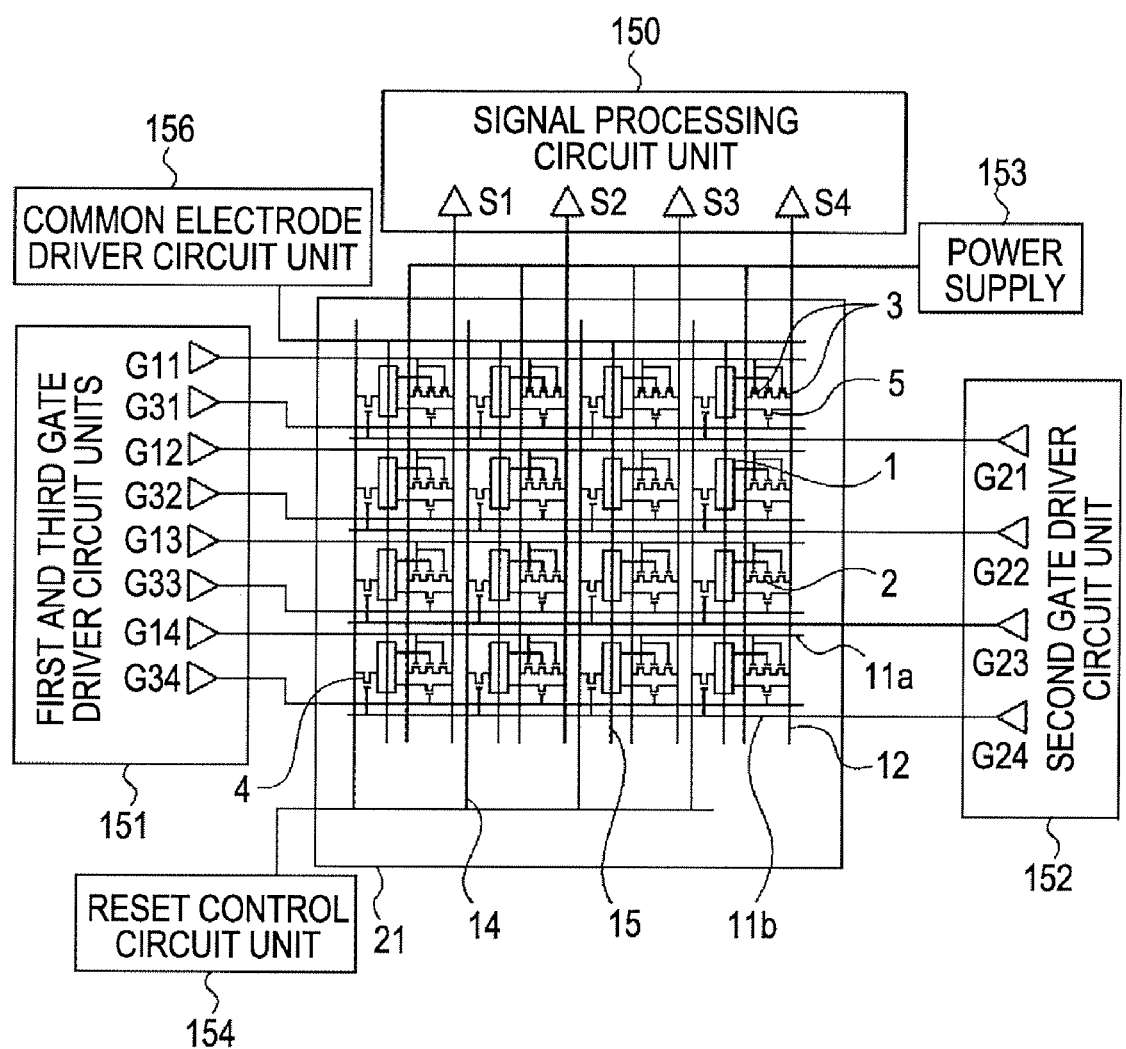
FIG. 20 is a schematic diagram of a different simple equivalent circuit and peripheral circuits in an imaging apparatus according to the second embodiment from that in FIG. 19.

FIGS. 13 to 20 show a second embodiment of the present invention. FIGS. 13, 16, and 18 are plan views of a pixel in an imaging apparatus according to the second embodiment. FIGS. 14, 15, and 17 are cross-sectional views of a pixel in the imaging apparatus. FIGS. 19 and 20 illustrate a simple equivalent circuit diagram and peripheral circuits.

The main characteristics of the present embodiment are that at least one of a gate wiring and a signal wiring is arranged in a region sandwiched between a plurality of insulating layers disposed between a TFT and a conversion element even in a top-gate polycrystalline silicon TFT.

FIG. 13 is a plan view of a pixel in an imaging apparatus according to a second embodiment of the present invention.

As illustrated in FIG. 13, a single pixel includes three TFTs consisting of a reading TFT 2, a selecting TFT 3 electrically connected to power-supply wiring 13 and the reading TFT 2, and a resetting TFT 4 electrically connected to reset wiring 14, as in the case of the first embodiment. The connection relationships between a conversion element 1, the TFTs 2 to 4, and the wirings are substantially the same as in the first embodiment.

FIG. 14 is a cross-sectional view taken along the line XIV-XIV of FIG. 13.

Each of the reading TFT 2 and the selecting TFT 3 illustrated in the drawing is a top-gate TFT using polycrystalline silicon and is disposed on a first insulating layer 31a on an insulation substrate 21. Each of the reading TFT 2 and the selecting TFT 3 is composed of a polycrystalline silicon layer 61 having a channel region and an impurity region, a first insulating layer 31b being a gate insulating layer, a first conductive layer 41 being a gate electrode 17, and a second conductive layer 42 including a source electrode and a drain electrode. First gate wiring 11a and second gate wiring 11b illustrated in FIG. 13 (not shown in FIG. 14) are disposed between the first insulating layer 31b and a second insulating layer 32a. In the case of a bottom-gate TFT, which is described in the first embodiment, when the bottom-gate TFT is formed using amorphous silicon, the mobility of the TFT is small. Thus, it is necessary to increase the channel width to reduce the resistance of the TFT. To this end, the capacitance between the electrodes of the TFT is increased, and the capacitance of wiring connected to these electrodes is undesirably increased. When a TFT using polycrystalline silicon is employed, as described in the present embodiment, the mobility of the TFT is improved, and it is possible to reduce the channel width of the TFT. The capacitance between the electrodes of the TFT can be reduced, and as a result, the wiring resistance can be reduced. When the TFT, which has a single channel region at a position facing the gate electrode, is a double-gate structure, leakage current can be further reduced. When a TFT that supplies a high voltage, such as the resetting TFT 4 and the selecting TFT 3, has a double-gate structure, a breakdown voltage between the source and drain electrodes can be further improved. When a TFT connected to the signal wiring handling weak current has a double-gate structure, the leakage current can be further reduced. Therefore, the S/N ratio of the imaging apparatus can be improved.

The conversion element 1 is an MIS conversion element composed of a fifth conductive layer 51, an insulating layer 33 of the conversion element 1, a second semiconductor layer 71, a second doped semiconductor layer 72 being an ohmic contact layer, and a sixth conductive layer 52 being a transparent electrode layer. A seventh conductive layer 53 constitutes bias wiring for applying a voltage to the conversion element 1. The seventh conductive layer 53 may be omitted if the sixth conductive layer 52 also serves as the bias wiring.

A second insulating film 32 is disposed between the conversion element 1 and the plurality of TFTs 2, 3, and 4 and is composed of a laminated film including a plurality of insulating layers (32a and 32b). The signal wiring 12, the power-supply wiring 13, and the reset wiring 14 are composed of the second conductive layer 42 disposed between the insulating layers of the second insulating film 32. The second insulating film 32 can be composed of a material that has a low dielectric constant and that allows the second insulating film 32 to have a large film thickness. The second insulating film 32 in the second embodiment is a flat organic insulating film. The thickness of each of the plurality of insulating layers of the second insulating film 32 can be between 1 µm and 10 µm, inclusive, preferably, between 2 µm and 10 µm, inclusive, and most preferably, between 3 µm and 10 µm, inclusive. If the total thickness of the plurality of insulating layers of the insulating film 32 exceeds 20 µm, a large step height undesirably forms a region where the adhesion properties of a photoresist are poor when the insulating film is coated with the photoresist. In addition, because the thickness of the photoresist is large only at a depression in the step portion, not all of the photoresist is completely exposed in the exposure and development processes performed thereafter, so an undesirable pattern residue is present. To avoid this, it is necessary for the plurality of insulating layers to have a total thickness of 20 µm or less. In the case of using an inorganic film as the second insulating film 32, it can be composed of a chemical-vapor deposition (CVD) film including silicon oxide ($SiO_2$) or tetraethyl orthosilicate (TEOS), and each layer of the second insulating film 32 can have a thickness of 1 µm or more. Such a configuration is advantageous to reduction in capacitance between a TFT having a large area in a pixel, in particular, a channel region, a source electrode, and a drain electrode, and wirings and a conversion element disposed thereabove. In the case where a plurality of TFTs is disposed, the number of wirings is large and the number of intersections of wirings is large. The above-described configuration is advantageous to reduction in the total capacitance between the wirings. In addition, it is advantageous especially when the line width of wiring disposed above the TFTs is increased such that the wirings cover the TFTs to actively reduce wiring resistance. As a result, the capacitance between the wirings can be reduced, and wiring illustrated in FIG. 13 can be formed so as to have a practical line width. The signal wiring 12 may be sandwiched between inorganic insulating layers to prevent weak leakage current from the wiring.

FIG. 15 is a cross-sectional view taken along the line XV-XV of FIG. 13.

The resetting TFT 4 illustrated in the drawing is a top-gate TFT using polycrystalline silicon and is disposed on the first insulating layer 31a. A contact portion 45 is a part of the same first conductive layer 41 as that being the gate electrode 17 of the reading TFT 2. The resetting TFT 4 and the contact portion 45 are connected to the fifth conductive layer 51, which is the lower (first) electrode of the conversion element 1, via respective through holes 16. The position of each of the through holes 16 in the second insulating layer 32a is not aligned with the position of each of the through holes 16 in the second insulating layer 32b. This can prevent an unstable process caused by formation of a second though hole immediately above a first though hole that may have a stepped portion formed at its central part depending on conditions when a conductive layer is formed over the first though hole formed by lithography.

FIG. 16 is a plan view of a pixel in the imaging apparatus according to the second embodiment. This pixel has a different configuration from that illustrated in FIG. 13.

The pixel illustrated in FIG. 16 differs from that in FIG. 13 in that the second insulating film includes a light absorbing area and a light transmitting area.

FIG. 17 is a cross-sectional view taken along the line XVII-XVII of FIG. 16. The second insulating layer 32a is made of a black matrix material that absorbs visible light. The second insulating layer 32b is made of a transparent material that transmits visible light. The fifth conductive layer 51, which is the lower (first) electrode of the conversion element 1, is composed of a transparent conductive film, such as indium tin oxide (ITO) film. Use of the black matrix material improves resolution (modulation transfer function (MTF)) because, when visible light is incident from a side adjacent to the sixth conductive layer 52, which is the upper (second) electrode of the conversion element 1, the transmission of visible light through the gap between the pixels can be reduced and thus optical crosstalk can be reduced. When a light-emitting member (not shown) is disposed on a side of the insulation substrate 21 remote from the conversion element 1, the conversion element 1 can be irradiated with light emitted from the light-emitting member through an opening 82 of the second insulating layer 32a. As a result, remaining carriers stored in the conversion element 1 can be recombined by the light irradiation and removed.

As described above, interposing the wiring between the second insulating layers enables a reduction in the wiring resistance and capacitance. In addition, the degree of flexibility in layout is improved. Providing the second insulating film 32 with the light absorbing area and the light transmitting area enables improvement in MTF and enhancement in sensitivity resulting from optical resetting capabilities.

FIG. 18 is a plan view of a pixel in the imaging apparatus according to the second embodiment. This pixel has a different configuration from that illustrated in FIG. 13.

The pixel illustrated in FIG. 18 differs from that in FIG. 13 in that a transferring TFT for reading electric charge obtained by conversion performed by the conversion element 1 without amplifying it.

As illustrated in FIG. 18, a transferring TFT 5 directly connecting the signal wiring 12 and the conversion element 1 is arranged in a two-dimensional structure shown in FIG. 13. The transferring TFT 5 is not a source-follower TFT and is arranged for directly reading electric charge obtained by conversion performed by the conversion element 1. The transferring TFT 5 does not have the capability of amplifying a signal, but it can read weak current with many levels. For example, it is advantageous when an image with many levels of gray is required in picking up a still image. Because the imaging apparatus has different uses for different purposes in this configuration, the transferring TFT 5 can be used as a still-image TFT. In this case, it is necessary to provide a switching circuit for switching gain to a signal processing circuit unit (not shown) connected to the signal wiring 12 or other units because a current or voltage supplied to the signal wiring 12 is small. The transferring TFT 5 can have a double-gate structure to smoothly handle weak current.

FIG. 19 illustrates a simple equivalent circuit diagram of an imaging apparatus that includes a panel having pixels each shown in FIG. 18 and peripheral circuits. The imaging apparatus includes the pixels, each having the conversion element 1 and the plurality of TFTs (2, 3, 4, and 5), arranged in a matrix, a substrate including the first gate wiring 11a, the second gate wiring 11b, and the signal wiring 12 corresponding to arrangement of the pixels and peripheral circuits, i.e., a signal processing circuit unit 150 and gate driver circuit units 151 and 152. A common electrode driver circuit unit 156 supplies a bias voltage to a bias wiring 15. A power supply 153 supplies a voltage or a current to the power-supply wiring 13. A reset control circuit unit 154 supplies a voltage to the reset wiring 14. The reading TFT 2 is used for reading a signal corresponding to an electric charge obtained by conversion performed by the conversion element 1. The selecting TFT 3 is used for selecting a pixel to be read. The resetting TFT 4 is used for resetting the electric charge that remains in the conversion element 1 after reading. The reading TFT 2 is a source-follower TFT that has the gate electrode 17 connected to the conversion element 1. The pixel differs from that in FIG. 12 in that the transferring TFT 5 directly connecting the conversion element 1 and the signal wiring 12 is included. The provision of the transferring TFT 5 enables a signal to be read with many levels, although the amount of transferred signals is reduced, and allows the imaging apparatus to have different uses for different purposes. An imaging apparatus in which the source-follower reading TFT 2 and the selecting TFT 3 are interchanged in terms of connection relationship, the source electrode 18 of the selecting TFT 3 is connected to the drain electrode 19 of the reading TFT 2, and the drain electrode 19 of the selecting TFT 3 is connected to the signal wiring 12 operates in the same manner.

FIG. 20 illustrates a simple equivalent circuit diagram different from FIG. 19. This diagram differs from FIG. 19 in that a source-follower TFT is sandwiched between two selecting TFTs 3 (3a, 3b). When the signal wiring 12 is directly connected to the source-follower TFT, if a noise component of, for example, electromagnetic waves is incident from the outside to the conversion element 1, the potential of the gate electrode 17 of the reading TFT 2 changes. Then, the state of depletion or storage of the TFT changes, and the capacitance between the source electrode 18 and the drain electrode 19 and the gate electrode 17 slightly changes. As a result, the capacitance distribution occurs in the pixel or the signal wiring 12 and this may lead to an artifact of an image. The same effects are shown in a reversed arrangement of the reading TFT 2 and the selecting TFT 3. If the conversion element 1 is directly connected to the reading TFT 2, when light is incident, the capacitance distribution occurs in the pixel, and this may lead to an artifact of an image. By connecting the reading TFT 2 between the two selecting TFTs (3a and 3b), the occurrence of an artifact of an image can be prevented even if a noise component of, for example, electromagnetic waves is incident on the conversion element 1. Such a configuration can be made due to a high degree of flexibility in layout and a structure in which overlapping of the wiring and the TFT does not cause poor characteristics. The above-described configurations described in the first and second embodiments can be combined in any combination.

Third Embodiment

Figure 21:
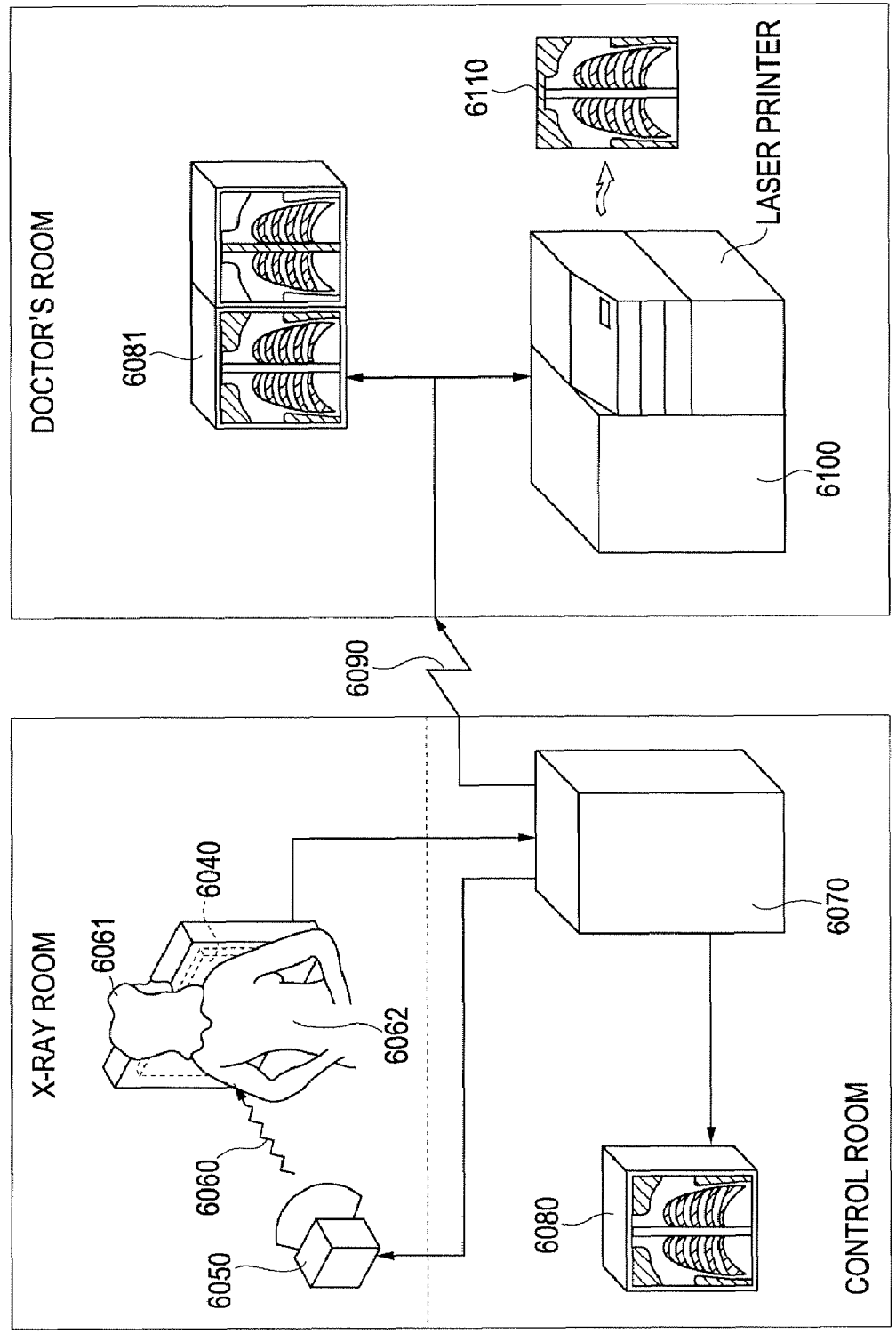
FIG. 21 illustrates an example of an application of an imaging apparatus according to at least one of the embodiments of the present invention to a radiation imaging system.

FIG. 21 illustrates an example of an application of a radiation imaging apparatus according to at least one of the embodiments of the present invention to a radiation imaging system.

An X-ray beam 6060 generated by an X-ray tube 6050 being a radiation source passes through a chest 6062 of a patient or subject 6061 and enters a radiation imaging apparatus 6040 including a scintillator disposed in the upper portion. The radiation imaging apparatus 6040 can include an image sensor. The incident X-ray beam contains information on the interior of the body of the subject 6061. In response to incidence of the X-ray beam, the scintillator emits light, and the radiation imaging apparatus 6040 photoelectrically converts the light and obtains electrical information. The information is converted into digital, and it is subjected to image processing performed by an image processor 6070 being a signal processing unit, and it observable on a display 6080 being a display unit in a control room.

The information can be transferred to a remote place by a transmission processing unit, such as a telephone line 6090, and can be displayed on a display 6081 being a display unit in a different location, such as a doctor's room, and stored in a recording unit, such as an optical disc. Therefore, a doctor at a remote place can carry out a diagnosis using the information. The information can also be recorded on film 6110 being a recording medium by a film processor 6100 being a recording unit.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-049368 filed Feb. 28, 2007 and No. 2008-027664 filed Feb. 7, 2008, which are hereby incorporated by reference herein in their entirety.

What is claimed is:

1. An imaging apparatus comprising:
an insulation substrate; and
a plurality of pixels disposed on the insulation substrate, wherein each of the plurality of pixels includes a plurality of thin-film transistors, a conversion element disposed above the plurality of thin-film transistors, and a plurality of insulating layers disposed between the conversion element and the plurality of thin-film transistors,
wherein the plurality of thin-film transistors comprises a reading thin-film transistor having a gate electrode electrically connected to the conversion element and a first selecting thin-film transistor electrically connected to a source electrode or a drain electrode of the reading thin-film transistor, and
wherein at least one of a signal wiring, to which a signal corresponding to an electric charge obtained by conversion of incident light or radiation performed by the conversion element is transferred, and a gate wiring that supplies a driving signal to a gate electrode of the first selecting thin-film transistor, is disposed between the plurality of insulating layers,
wherein each of the pixels further includes a second selecting thin-film transistor electrically connected to the gate wiring, and
wherein each of the source electrode and the drain electrode of the reading thin-film transistor is electrically connected to either one of the first selecting thin-film transistor and the second selecting thin-film transistor.

2. The imaging apparatus according to claim 1, wherein each of the plurality of insulating layers has a thickness larger than a thickness of a gate insulating layer of each of the plurality of thin-film transistors.

3. The imaging apparatus according to claim 1, wherein the thickness of each of the plurality of insulating layers is between 1 μm and 10 μm, inclusive.

4. The imaging apparatus according to claim 1, wherein each of the pixels further includes a resetting thin-film transistor connected to the conversion element and configured to supply a reset potential.

5. The imaging apparatus according to claim 1, wherein each of the pixels further includes a transferring thin-film transistor electrically connected between the conversion element and the signal wiring and configured to transfer electric charge obtained by conversion performed by the conversion element.

6. A radiation imaging system comprising:
an imaging apparatus comprised of an insulation substrate, and a plurality of pixels disposed on the insulation substrate, wherein each of the plurality of pixels includes a plurality of thin-film transistors, a conversion element disposed above the plurality of thin-film transistors, and a plurality of insulating layers disposed between the conversion element and the plurality of thin-film transistors,
wherein the plurality of thin-film transistors comprises a reading thin-film transistor having a gate electrode electrically connected to the conversion element and a first selecting thin-film transistor electrically connected to a source electrode or a drain electrode of the reading thin-film transistor, and
wherein at least one of a signal wiring, to which a signal corresponding to an electric charge obtained by conversion of incident light or radiation performed by the conversion element is transferred, and a gate wiring that supplies a driving signal to a gate electrode of the first selecting thin-film transistor, is disposed between the plurality of insulating layers;
a signal processing unit configured to process a signal from the imaging apparatus;
a recording unit configured to record a signal from the signal processing unit;
a display unit configured to display a signal from the signal processing unit;
a transmission processing unit configured to transmit a signal supplied from the signal processing unit; and
a radiation source configured to generate the radiation,
wherein each of the pixels further includes a second selecting thin-film transistor electrically connected to the gate wiring, and
wherein each of the source electrode and the drain electrode of the reading thin-film transistor is electrically connected to either one of the first selecting thin-film transistor and the second selecting thin-film transistor.

7. The radiation imaging system according to claim 6, wherein each of the plurality of insulating layers has a thickness larger than a thickness of a gate insulating layer of each of the plurality of thin-film transistors.

8. The radiation imaging system according to claim 6, wherein the thickness of each of the plurality of insulating layers is between 1 μm and 10 μm, inclusive.

9. The radiation imaging system according to claim 6, wherein each of the pixels further includes a resetting thin-film transistor connected to the conversion element and configured to supply a reset potential.

10. The radiation imaging system according to claim 6, wherein each of the pixels further includes a transferring thin-film transistor electrically connected between the conversion element and the signal wiring and configured to transfer electric charge obtained by conversion performed by the conversion element.

* * * * *